(12) United States Patent
Wong et al.

(10) Patent No.: US 11,973,122 B2
(45) Date of Patent: Apr. 30, 2024

(54) NANO-FET SEMICONDUCTOR DEVICE AND METHOD OF FORMING

(71) Applicant: Taiwan Semiconductor Manufacturing Co., Ltd., Hsinchu (TW)

(72) Inventors: I-Hsieh Wong, Hsinchu (TW); Wei-Yang Lee, Taipei (TW); Chia-Pin Lin, Xinpu Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 240 days.

(21) Appl. No.: 17/406,937

(22) Filed: Aug. 19, 2021

(65) Prior Publication Data

US 2022/0310816 A1     Sep. 29, 2022

Related U.S. Application Data

(60) Provisional application No. 63/166,366, filed on Mar. 26, 2021.

(51) Int. Cl.
| | | |
|---|---|---|
| H01L 29/423 | (2006.01) | |
| H01L 29/06 | (2006.01) | |
| H01L 29/417 | (2006.01) | |
| H01L 29/66 | (2006.01) | |
| H01L 29/786 | (2006.01) | |

(52) U.S. Cl.
CPC .... *H01L 29/42392* (2013.01); *H01L 29/0665* (2013.01); *H01L 29/41775* (2013.01); *H01L 29/66545* (2013.01); *H01L 29/66553* (2013.01); *H01L 29/6656* (2013.01); *H01L 29/78696* (2013.01)

(58) Field of Classification Search
CPC ......... H01L 21/02603; H01L 21/28141; H01L 21/823431; H01L 21/823821; H01L 21/845; H01L 27/0886; H01L 27/0924; H01L 27/1211; H01L 29/0653; H01L 29/0665; H01L 29/0669; H01L 29/0673; H01L 29/41766; H01L 29/41791; H01L 29/72392; H01L 29/66439; H01L 29/6653; H01L 29/66545; H01L 29/66553; H01L 29/6656; H01L 29/66795; H01L 29/775; H01L 29/785; H01L 29/7851; H01L 29/7853; H01L 29/7855; H01L 29/78696; H01L 2029/7858

See application file for complete search history.

(56) References Cited

U.S. PATENT DOCUMENTS

| | | | |
|---|---|---|---|
| 2019/0006485 A1* | 1/2019 | Kim | ................. H01L 29/66439 |
| 2019/0198645 A1* | 6/2019 | Cheng | ................ H01L 29/66742 |
| 2019/0214459 A1* | 7/2019 | Cheng | .................... B82Y 10/00 |

(Continued)

*Primary Examiner* — David C Spalla
(74) *Attorney, Agent, or Firm* — Slater Matsil, LLP

(57) ABSTRACT

Embodiments utilize a two layer inner spacer structure during formation of the inner spacers of a nano-FET device. The materials of the first inner spacer layer and second inner spacer layer can be selected to have a mismatch in their coefficients of thermal expansion (CTE). As the structure cools after deposition, the inner spacer layer which has a larger CTE will exhibit compressive stress on the other inner spacer layer, however, because the two layers have a common interface, the layer with the smaller CTE will exhibit a counter acting tensile stress.

20 Claims, 35 Drawing Sheets

(56) References Cited

U.S. PATENT DOCUMENTS

2020/0051981 A1\* 2/2020 Yang ................. H01L 21/02603
2020/0357911 A1\* 11/2020 Frougier ........... H01L 29/42392
2021/0234018 A1\* 7/2021 Xie ................... H01L 29/66553

\* cited by examiner

NANO-FET SEMICONDUCTOR DEVICE AND METHOD OF FORMING

PRIORITY CLAIM AND CROSS-REFERENCE

This patent claims priority to U.S. Provisional Application No. 63/166,366, filed on Mar. 26, 2021, which application is hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 also includes a top down view of an intermediate stage in the manufacturing of nano-FETs, in accordance with some embodiments.

DETAILED DESCRIPTION

Figure 1:
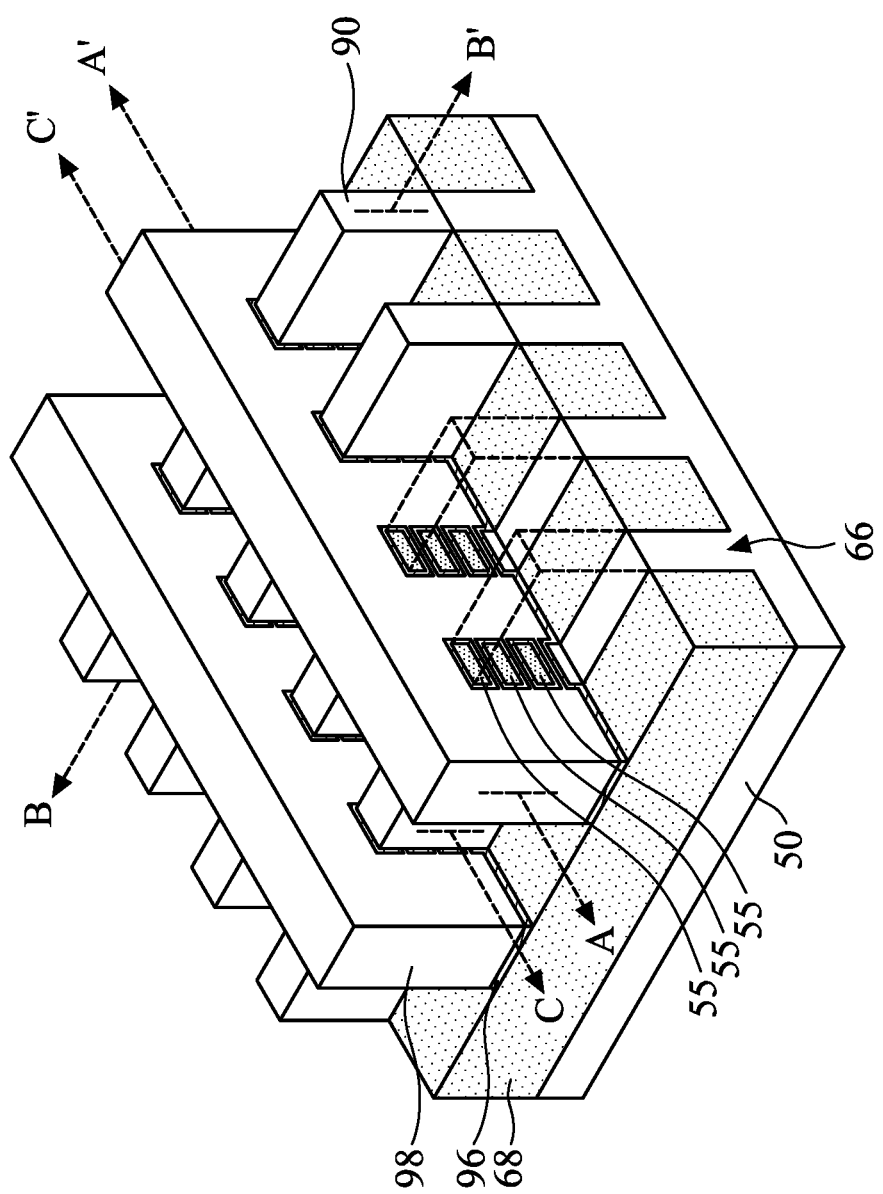
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs.

As will be discussed in greater detail below, in forming nano-FET transistor devices, parallel fins of alternating nanosheets or nanostructures are formed from a multi-layer stack of semiconductor materials. Shallow trench isolation (STI) regions are then formed at the base of the parallel fins. Next, boundary regions or boundary structures are formed to form separations in the parallel fins. Next, parallel dummy gates are formed over the parallel fins and STI region perpendicular to the fins. The dummy gates cover channel areas of the parallel fins. Due to pattern loading effects, all the fins and dummy gates are patterned in the same processes. As a result, a boundary dummy gate may be formed over the boundary structures or partially over the boundary structures. When source/drain regions are later formed in the fins adjacent the boundary dummy gate, a recess is made on one side of the boundary dummy gate and not the other side of the boundary dummy gate. The recess exposes the nanostructures of the fins, which are laterally recessed for sidewall spacers. When a sidewall spacer layer is deposited in the recess and over the boundary dummy gate, the sidewall spacer layer is much longer on one side of the boundary dummy gate than the other side of the boundary dummy gate, since the sidewall spacer layer extends down into the recess on the one side of the boundary dummy gate and does not extend down into a recess on the other side of the boundary dummy gate. When the structure cools after the sidewall spacer layer deposition, the greater linear shrinkage of the sidewall spacer layer can cause compressive stress on the boundary dummy gate which can cause it to bend or tilt toward the recess. To help prevent the boundary dummy gate from bending, embodiments of the present disclosure utilize a two layer inner spacer structure during formation of the inner spacers of a nano-FET device. The materials of the first inner spacer layer and second inner spacer layer can be deliberately selected to have a mismatch in their coefficients of thermal expansion (CTE). As the structure cools after deposition, the layer which has a larger CTE will exhibit compressive stress on the other layer, however, because the two layers have a common interface, the layer with the smaller CTE will exhibit a counter acting tensile stress. The countering stress can counter the first stress so that the edge gate does not bend.

FIG. 1 illustrates an example of nano-FETs (e.g., nanowire FETs, nanosheet FETs (NSFETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 21C are cross-sectional views of intermediate stages in the manufacturing of nano-FETs, in accordance with some embodiments. FIGS. 2, 3, 4, 7A, 8A, 19A, 20A, and 21A illustrate reference cross-section A-A' illustrated in FIG. 1. FIGS. 5, 6, 7B, 8B, 10B, 11B, 12, 13, 14, 15, 16, 17, 18B, 19B, 20B, and 21B illustrate reference cross-section B-B' illustrated in FIG. 1. FIGS. 9, 10A, 11A, 18A, 18C, 20C, and 21C illustrate reference cross-section C-C' illustrated in FIG. 1. FIGS. 22A, 22B, and 22C are cross-sectional views of nano-FETs, in accordance with some embodiments.

Figure 2:
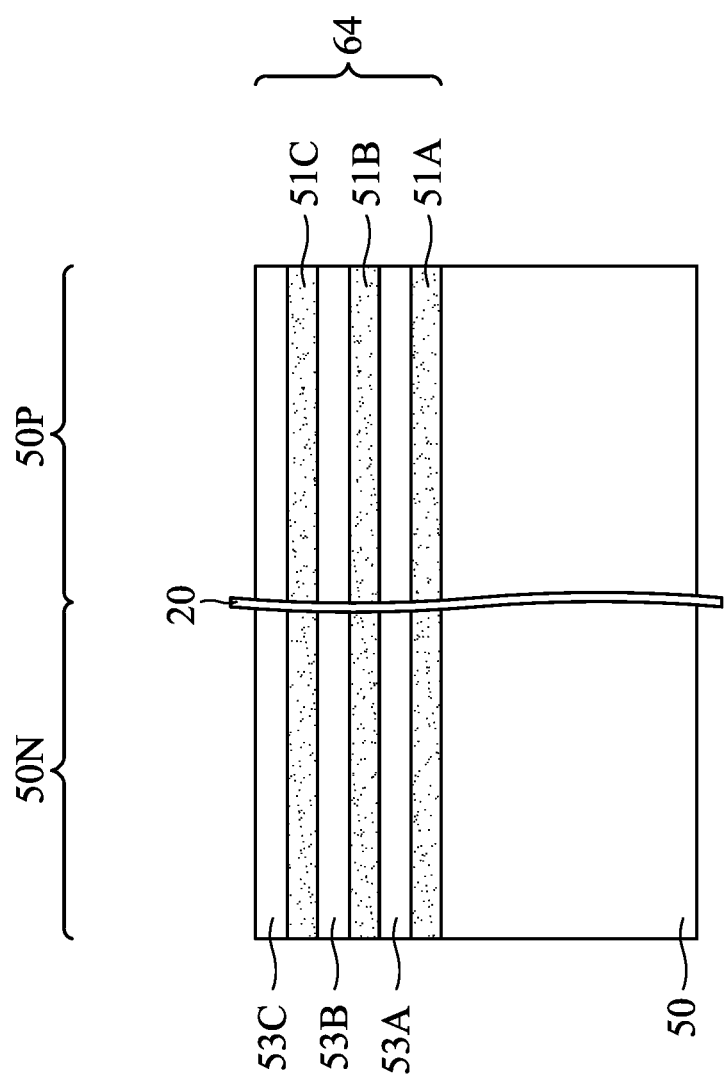
FIGS. 2, 3, 4, 5, 6, 7A, 7B, 8A, 8B, 9, 10A, 10B, 11A, 11B, 12, 13, 14, 15, 16, 17, 18A, 18B, 18C, 19A, 19B, 20A, 20B, 20C, 21A, 21B, and 21C are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 25A, 25B, and 25C illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
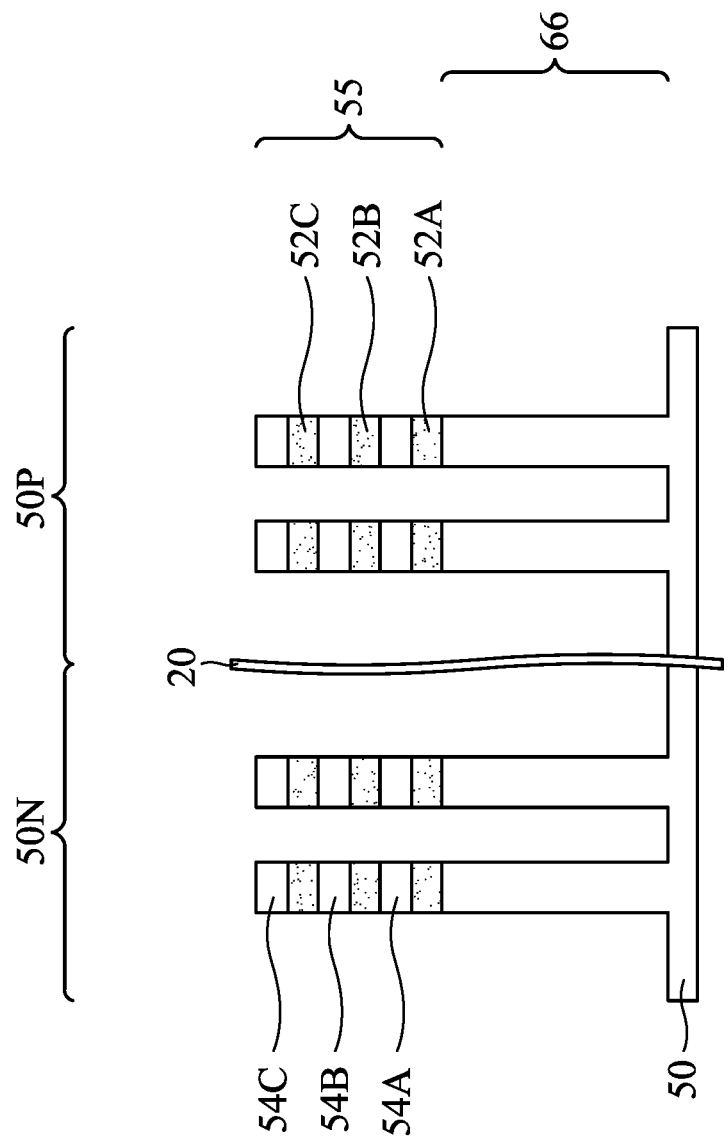

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66. To achieve good patterning results, in particular using double-patterning or multi-patterning processes, the fins 66 which are formed may be formed over the entire surface of the fin area of the workpiece in a uniform pattern. The pattern may later be cut to remove fins or portions of fins as needed for device separation and design purposes. Using a uniform pattern increases yield by reducing deleterious pattern loading effects which can occur if using non-uniform patterns.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
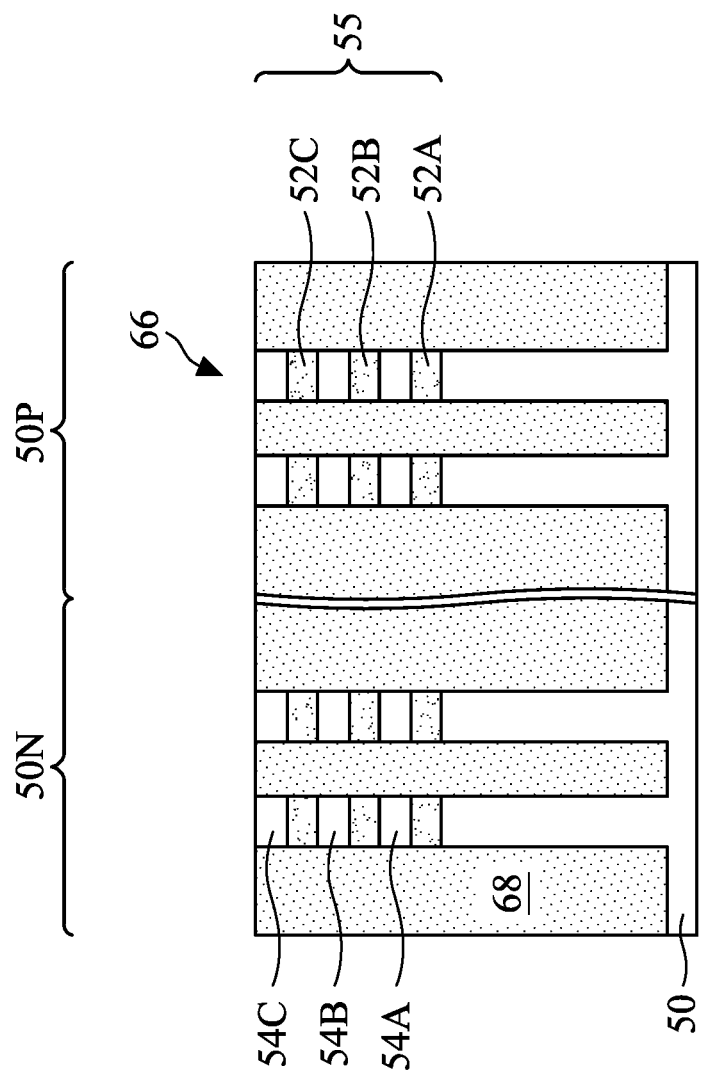

In FIG. 4, shallow trench isolation (STI) regions 68 are formed adjacent the fins 66 and in the opening 75. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

Figure 5:
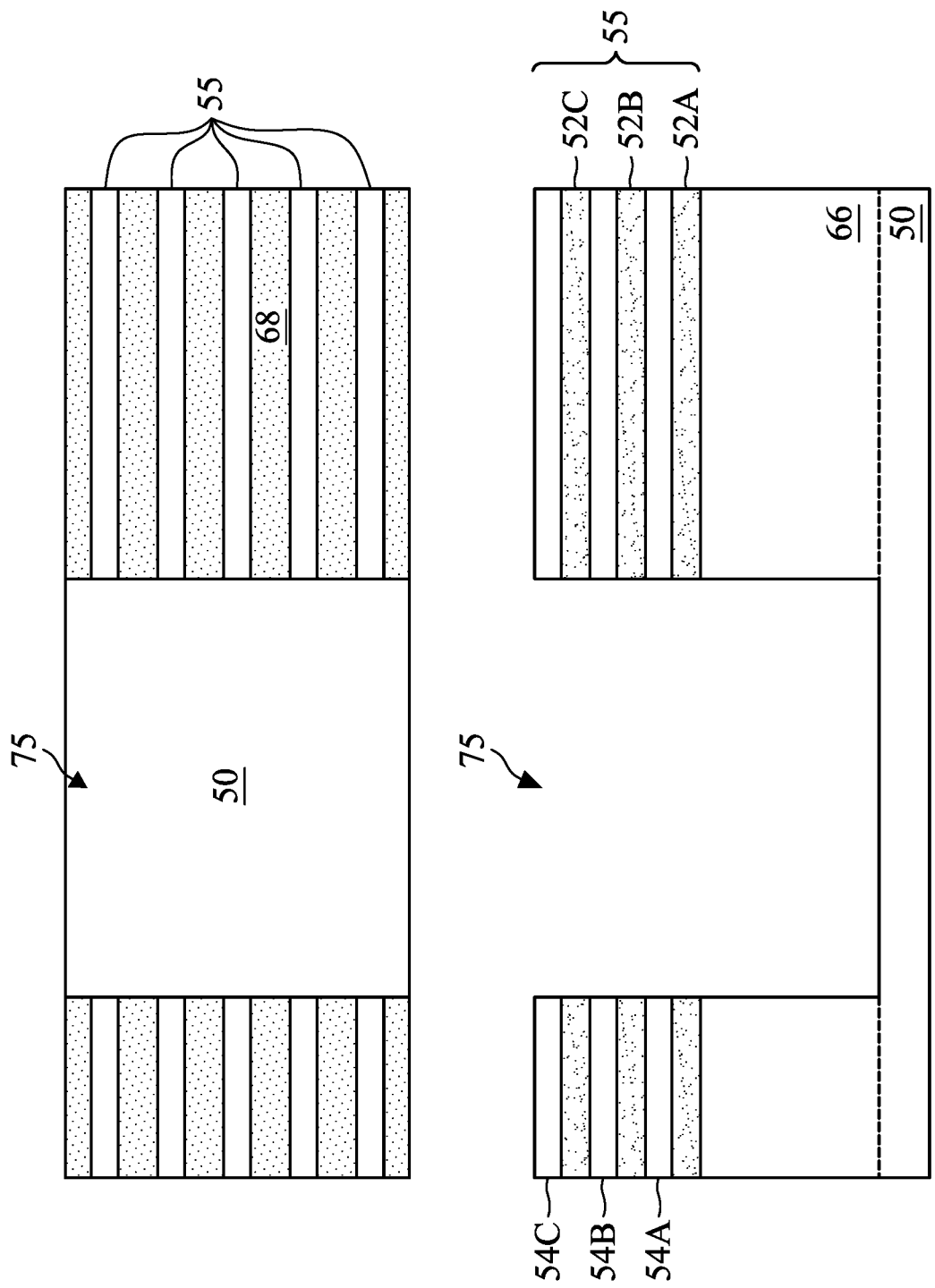
Figure 6:
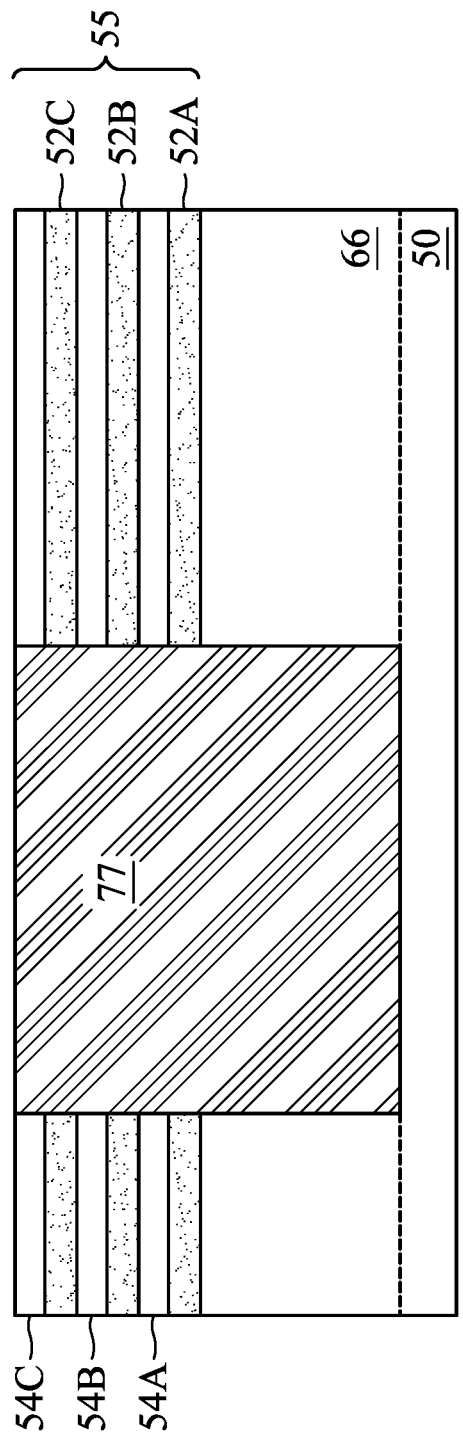

FIGS. 5 and 6 illustrate a fin-cut and boundary formation process. The illustrations in FIGS. 5 and 6 may apply to either the n-type region 50N or the p-type region 50P. It should be appreciated that the fin-cut and boundary formation process may be performed before forming the STI regions 68 or after forming the STI regions 68. The bottom portion of FIG. 5 is a cross-sectional view along the reference cross section B-B' of FIG. 1, and the upper portion of FIG. 5 is a partial top down view. In FIG. 5, openings 75 are formed to separate fins 66 from each other lengthwise. The fin-cut process patterns the fins 66 to separate one lengthwise portion of the fins 66 from another lengthwise portion of the fin 66 by forming an opening 75 between the two fin portions. The fin-cut process may be used to define boundaries between device areas of the resulting nano-FETs. The openings 75 may extend across several parallel fins 66, such as illustrated in the top down view of FIG. 5.

The openings 75 may be formed by forming a mask over the top of the STI regions 68 and fins 66 and patterning the mask to form an opening in the mask corresponding to the openings 75. The mask may be a multi-layered mask and may have a photosensitive component so that the mask may be patterned using photolithography or a combination of photolithography and etching. Then the mask may be used to etch back the STI region 68 to recess the STI region 68. The STI regions 68 may be recessed using an acceptable etching process, such as one that is selective to the material of the insulation material of the STI regions 68. For example, an oxide removal using, for example, dilute hydrofluoric (dHF) acid may be used. In Although FIG. 5 shows all of the STI regions 68 removed, in some embodiments a bottom portion of the STI regions 68 may remain surrounding a base of the fins 66. Next, the fins 66 are removed, including the overlying nanostructures 55. Using the same mask, the exposed fins 66 may be removed by a suitable etching process. In some embodiments, a variety of suitable etchants and etching processes may be used to successively remove the material of the nanostructures 55 and then the bottom portion of the fins 66. In other embodiments, a dry etching process, such as a reactive ion etching can remove both the fins 66 and the STI regions 68 at the same time. After forming the openings 75, the mask may be removed by an acceptable process, such as by ashing, grinding, the like, or combinations thereof. In some embodiments, the mask may be removed after forming the boundary structure 77, described below.

In FIG. 6, a boundary structure 77 is formed in the openings 75. Although a particular procedure is provided below for forming the boundary structure 77, it should be understood that other processes may be used to form the boundary structure 77. In general, the boundary structure 77 is an insulating structure disposed between a first portion of the fin 66 and a second portion of the fin 66 or between the first portion of the fin 66 and other devices or structures on the other side of the boundary structure. The boundary structure 77 may be formed using processes and materials similar to those used to form the STI regions 68. In some embodiments the boundary structure 77 may include different insulating layers, including a liner layer and a fill layer. In some embodiments an insulating capping layer may be formed over the fill layer and may, in some embodiments, protrude higher than the upper surface of the nano structure 54C.

If a liner layer is used, the liner layer may including any suitable insulating material, such as silicon nitride, silicon carbide, silicon oxynitride, silicon oxide, the like, or combination thereof. Other insulating materials may be used and are contemplated. The liner layer may be deposited using any suitable process, such as PVD, ALD, CVD, and so forth. The liner layer may be conformal to the opening 75. The fill layer may be deposited over the liner layer. The fill layer may be made of the same material or different material as the insulating material of the STI regions 68 and may be deposited using similar processes and materials. Following the deposition of the fill layer, a removal process may be performed to remove excess insulation material over the nanostructures 55. In some embodiments, a planarization process such as a chemical mechanical polish (CMP), an etch-back process, combinations thereof, or the like may be utilized.

In some embodiments, an insulating capping layer is formed over the fill layer. The insulating capping layer may be formed by depositing an insulating material layer over the nanostructures 55, STI regions 68 and fill layer of the boundary structure 77. The insulating capping layer may be deposited using any suitable technique, such as by CVD, PVD, spin on, the like, or combination thereof. The material of the insulating capping layer may include any suitable insulating material. In some embodiments, the insulating capping layer is formed of a high-k or non-low-k dielectric materials such as silicon oxide, silicon carbide (SiC), silicon carbo-nitride (SiCN), silicon oxy-carbo-nitride (SiOCN), or the like. The insulating capping layer may then be patterned using acceptable photolithography techniques to remove the unwanted material of the insulating capping layer, for example, the portions of the insulating capping layer over the fins 66 and STI regions 68. The completed structure is a boundary structure 77, the boundary structure 77 including the optional liner layer, fill layer, and optional insulating capping layer.

Figure 7A:
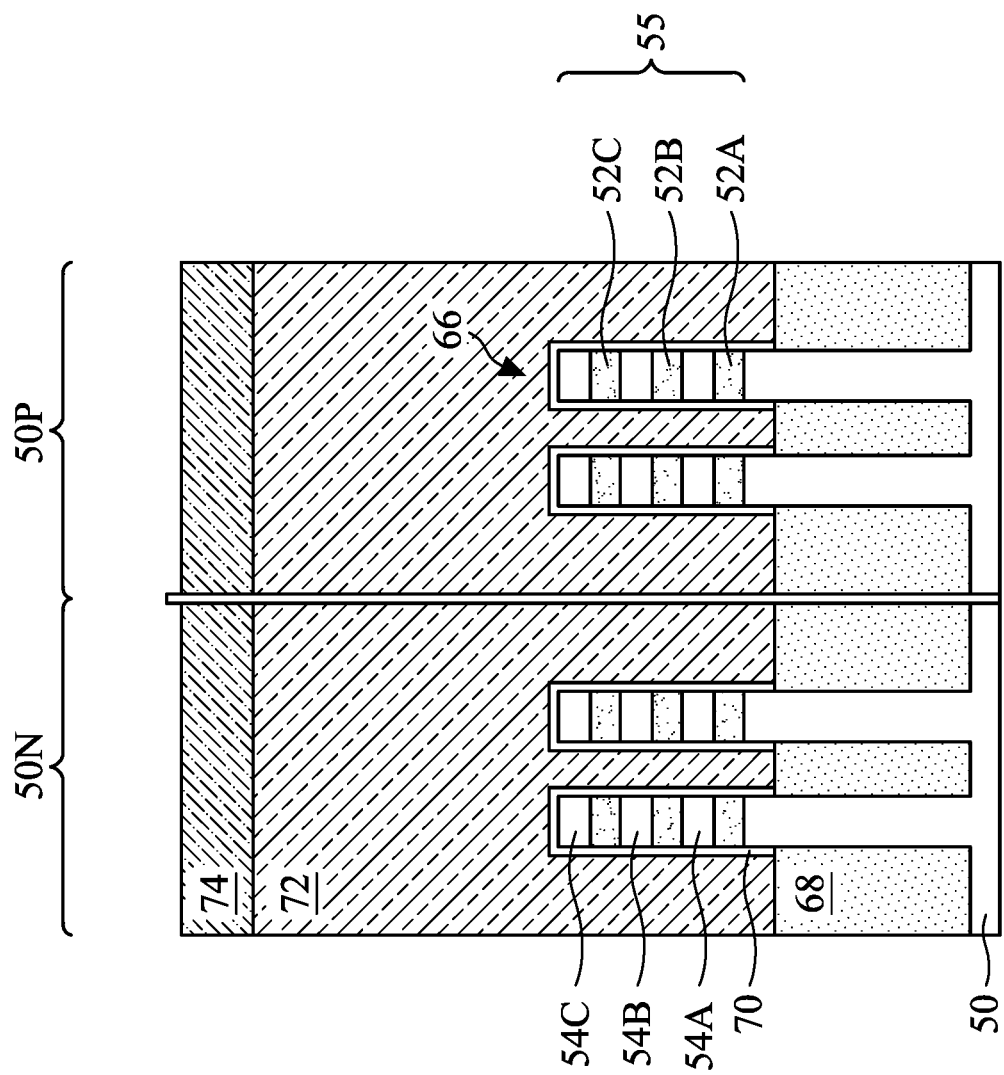
Figure 7B:
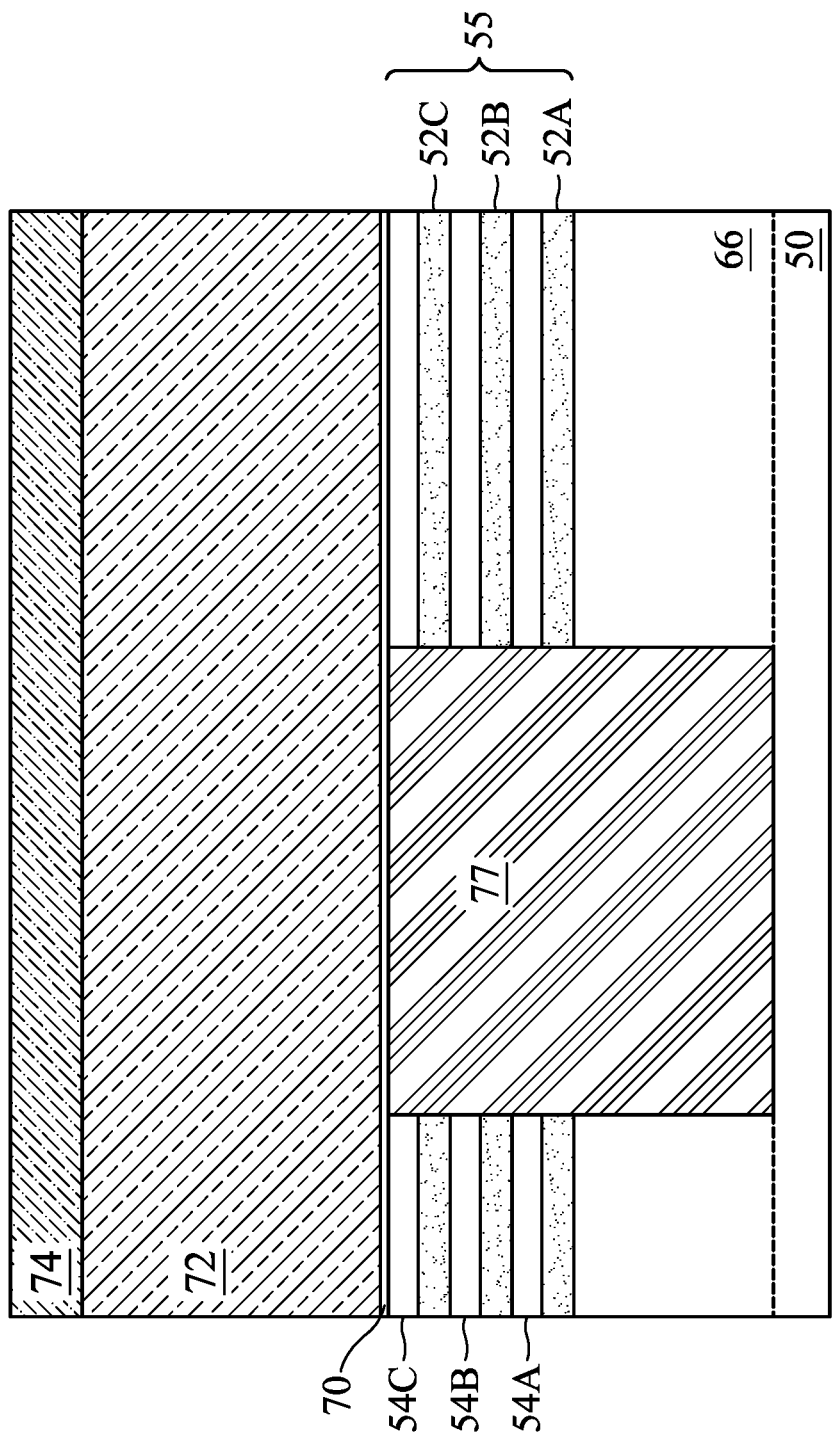

In FIGS. 7A and 7B, the insulation material of the STI regions 68 is then recessed between the fins 66 to finish forming the STI regions 68 between the fins 66. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used. If used, the insulating capping layer may serve as a mask to prevent etching the fill layer of the boundary structure 77.

The process described above with respect to FIGS. 2 through 7B is just one example of how the fins 66, the nanostructures 55, the STI region 68, and the boundary structures 77 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIGS. 7A and 7B, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Still referring to FIGS. 7A and 7B, a dummy dielectric layer 70 is formed on the fins 66, boundary structure 77, STI region 68, and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 8A:
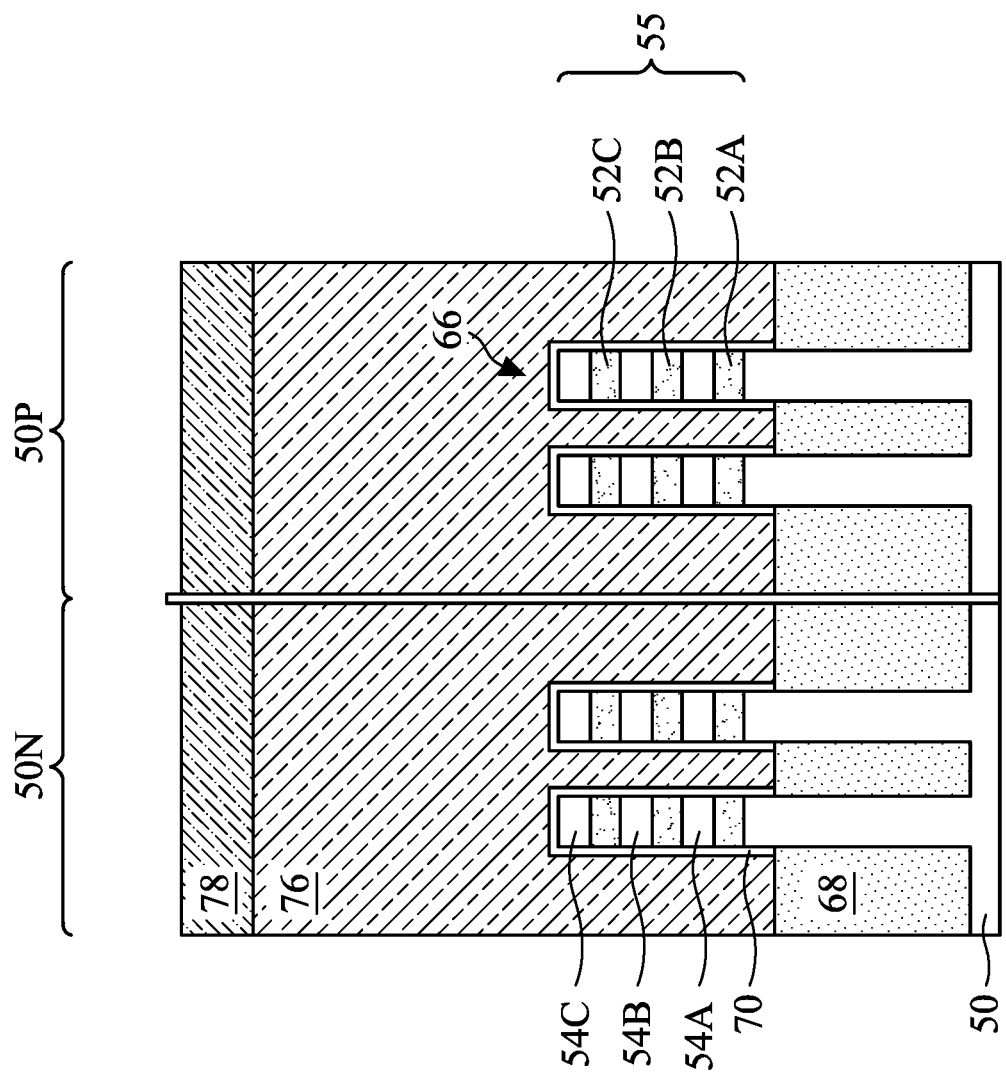
Figure 8B:
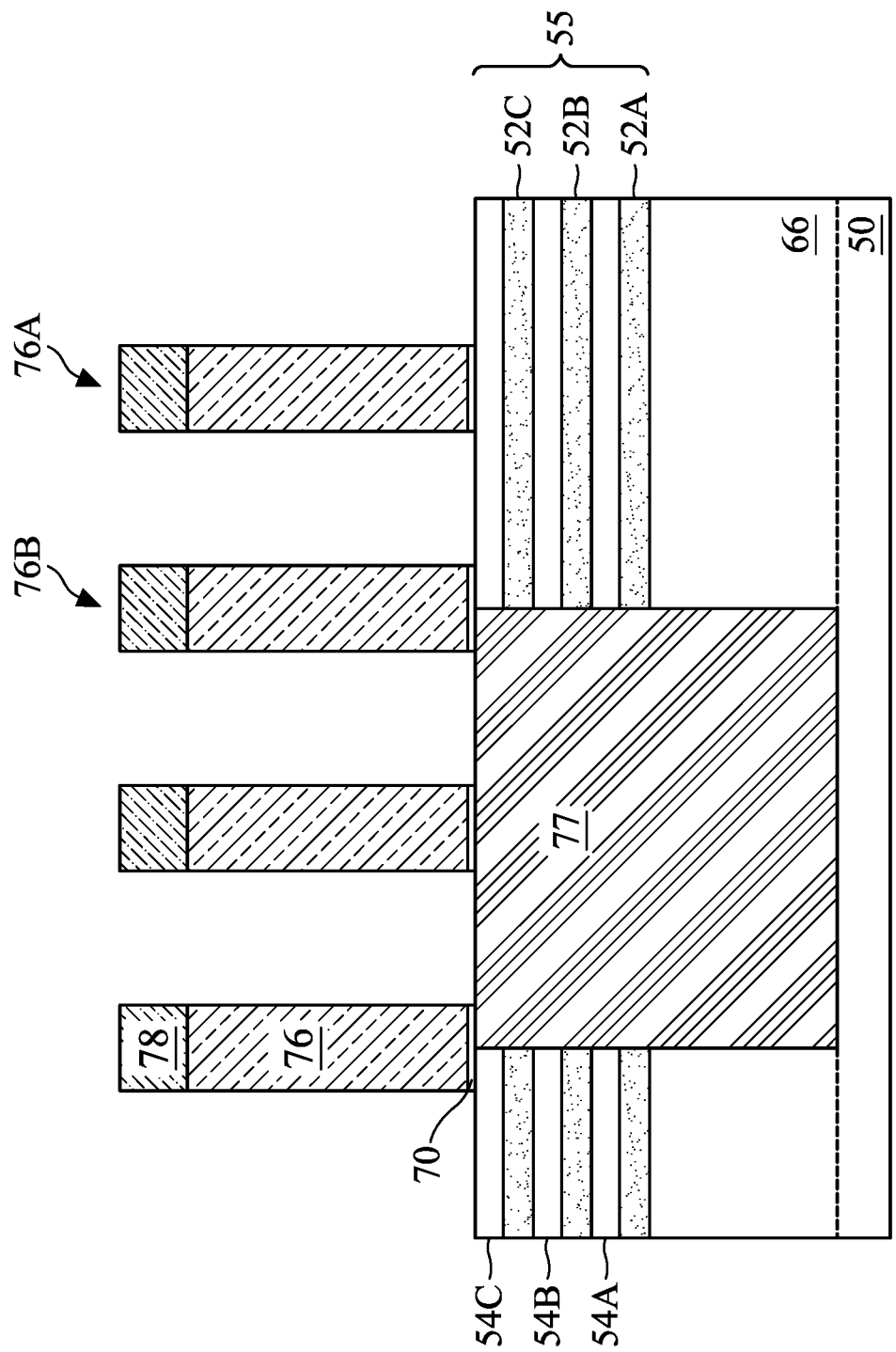

In FIGS. 8A and 8B, the mask layer 74 (see FIGS. 7A and 7B) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66. It may be advantageous to form all the dummy gates 76 at the same time using a uniform pattern to reduce negative pattern loading effects. Dummy gates 76 may be later cut or removed as needed to form desired devices.

As illustrated in FIG. 8B, a first set of the dummy gates 76, the dummy gates 76A will be replaced and become active gates. A second set of the dummy gates 76, the dummy gates 76B are disposed over the boundary structures 77 or too close to the boundary structures 77 to be used as an active gate. The dummy gates 76B will also be replaced but remain inactive gates. The dummy gates 76B may be left in the pattern for pattern loading purposes. In some embodiments, the dummy gates 76B may be partially disposed over the edge of the boundary structure 77 and may be partially disposed over the fins 66.

Figure 9:
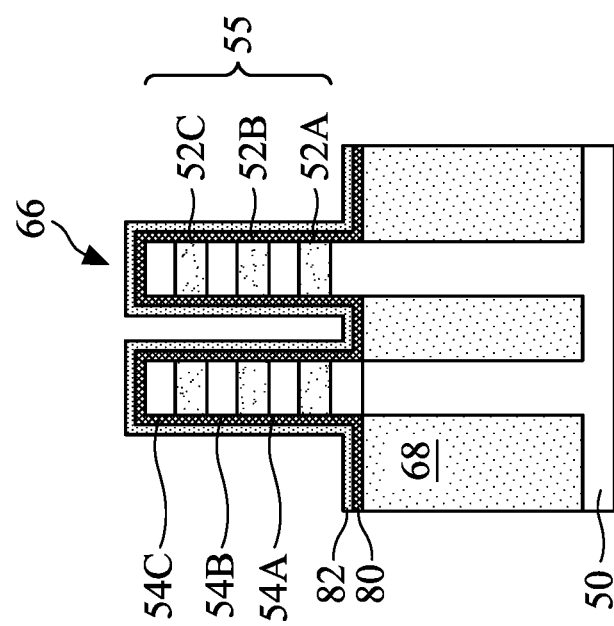

FIGS. 9 through 20C illustrate various additional steps in the manufacturing of embodiment devices. FIGS. 9, 10A, 11A, 18A, 18C, 20C, 21C, and 22C illustrate features in either the n-type regions 50N or the p-type regions 50P. In FIG. 9, a first spacer layer 80 and a second spacer layer 82 are formed over the structures illustrated in FIGS. 8A and 8B. The first spacer layer 80 and the second spacer layer 82 will be subsequently patterned to act as spacers for forming self-aligned source/drain regions. The first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 9, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 10A:
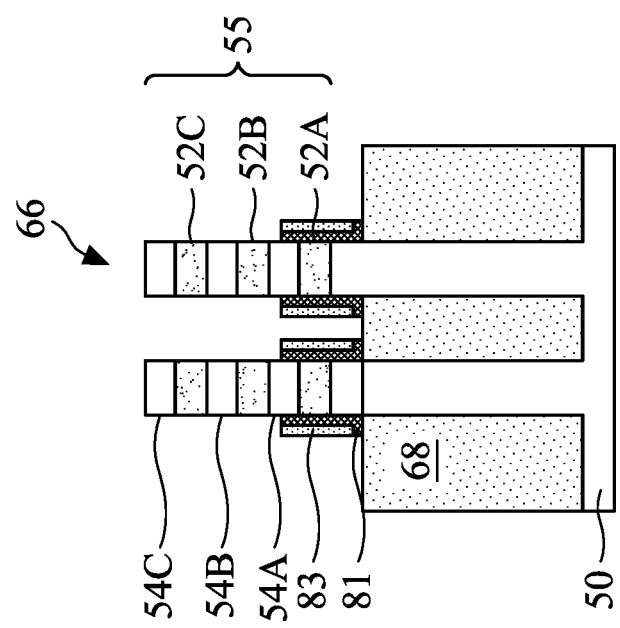
Figure 10B:
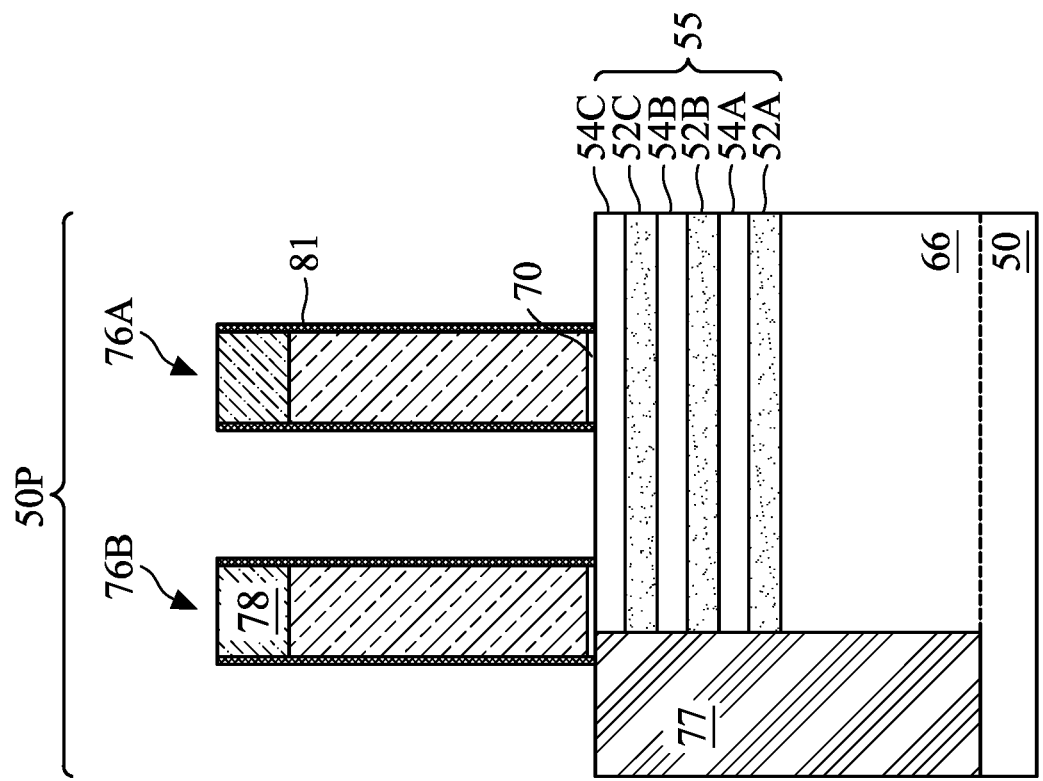
Figure 10B:
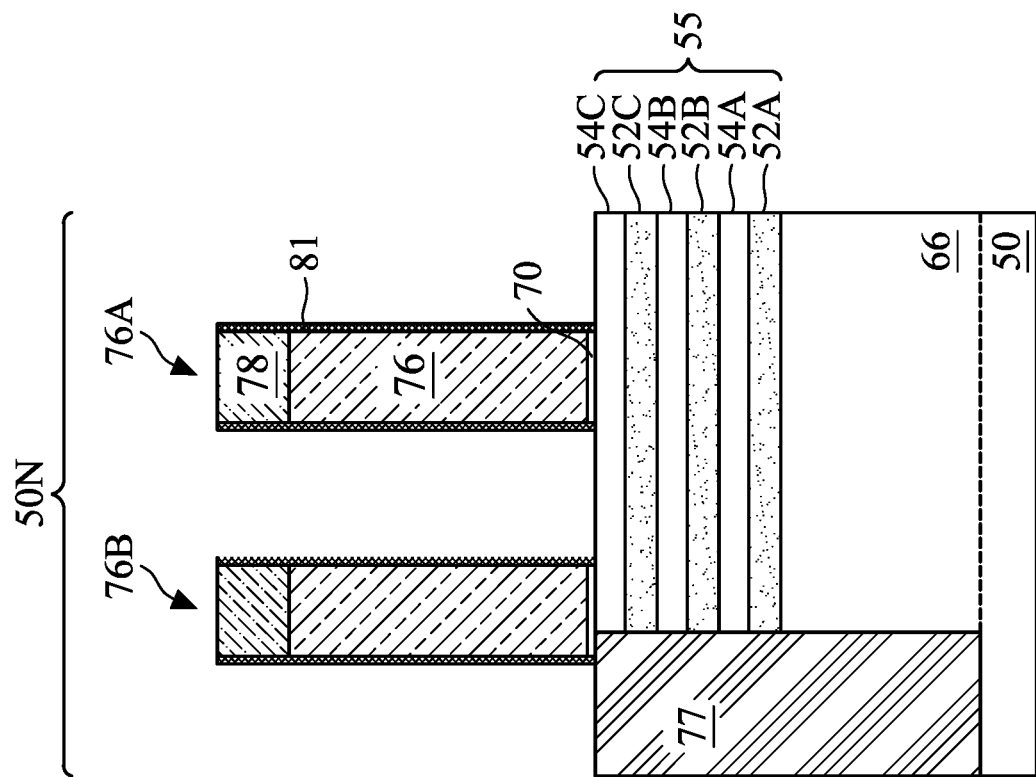

In FIGS. 10A and 10B, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 10A. Thereafter, the second spacers 83 acts as a mask while etching exposed portions of the first spacer layer 80, thereby forming first spacers 81 as illustrated in FIG. 10A.

As illustrated in FIG. 10A, the first spacers 81 and the second spacers 83 are disposed on sidewalls of the fins 66 and/or nanostructures 55. As illustrated in FIG. 10B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy dielectric layers 60. In other embodiments, a portion of the second spacer layer 82 may remain over the first spacer layer 80 adjacent the masks 78, the dummy gates 76, and the dummy gate dielectrics 71. FIG. 10B illustrates part of the structure of FIG. 8B in each of the n-type region 50N and the p-type region 50P.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 11A:
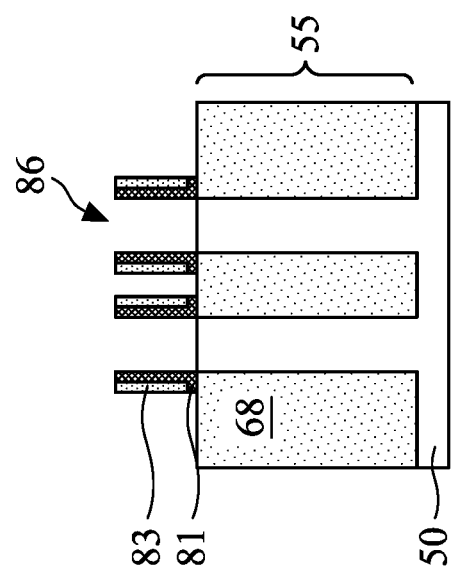
Figure 11B:
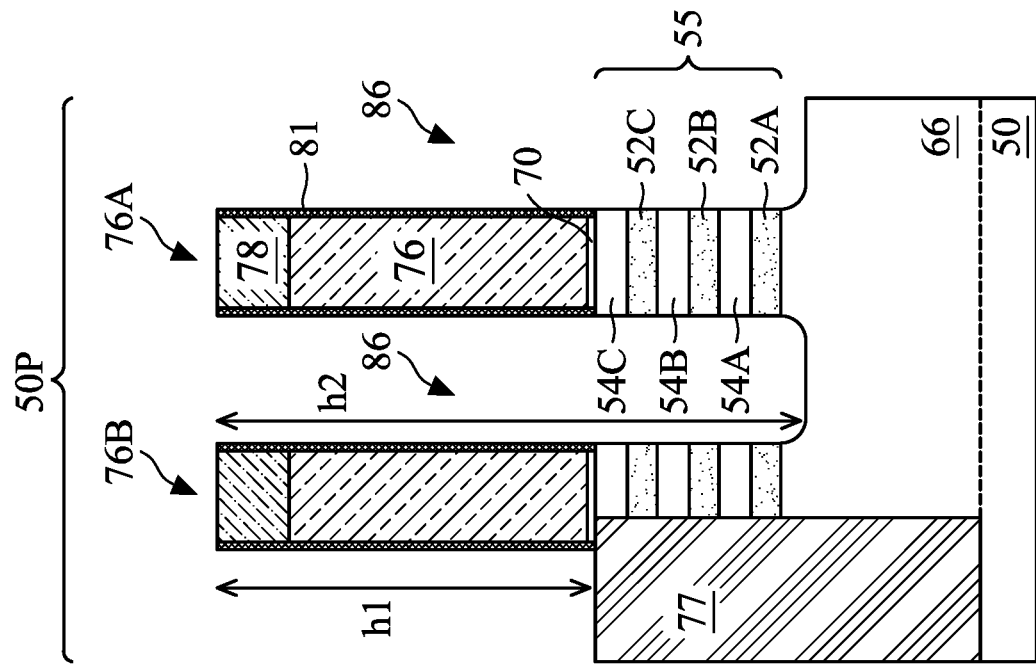
Figure 11B:
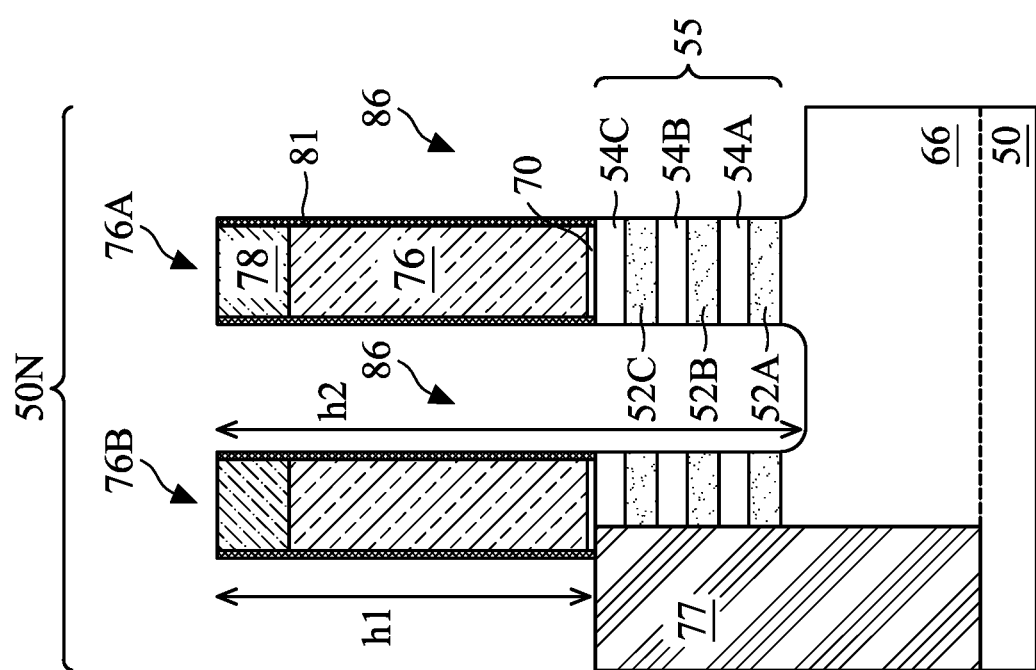

In FIGS. 11A and 11B, first recesses 86 are formed in the fins 66, the nanostructures 55, and the substrate 50, in accordance with some embodiments. First recess 86 are not formed in the boundary structures 77. Epitaxial source/drain regions will be subsequently formed in the first recesses 86. The first recesses 86 may extend through the first nanostructures 52 and the second nanostructures 54, and into the substrate 50. As illustrated in FIG. 11A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, the masks 78, and the insulating layer 79 mask portions of the fins 66, the nanostructures 55, and the substrate 50 during the etching processes used to form the first recesses 86. Other etch masks may also be used as needed to mask other areas, such as the boundary structures 77. In some embodiments, the insulating capping layer of the boundary structures 77 (if used) may act as an etch mask for etching the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

As illustrated in FIG. 11B, the dummy boundary gate 76B is disposed overlapping both the boundary structure 77 and the nanostructures 55. The first recesses 86 are formed in the nanostructures 55 and the substrate 50 on one side of the dummy boundary gate 76B. On the other side of the dummy boundary gate 76B, first recesses 86 are not formed in the boundary structure 77. As a result, the height h1 corresponds to height of the dummy boundary gate 76B over the boundary structure 77. The height h2 corresponds to the height h1 of the dummy boundary gate 76B over the nanostructures 55 combined with the depth of the first recesses 86. In some embodiments, the height h2 may be between about 1.2 to about 3.0 times the height h1. In other words, a ratio of h1 to h2 may be between about 1:1.2 and 1:3, though other ratios may be used.

Figure 12:
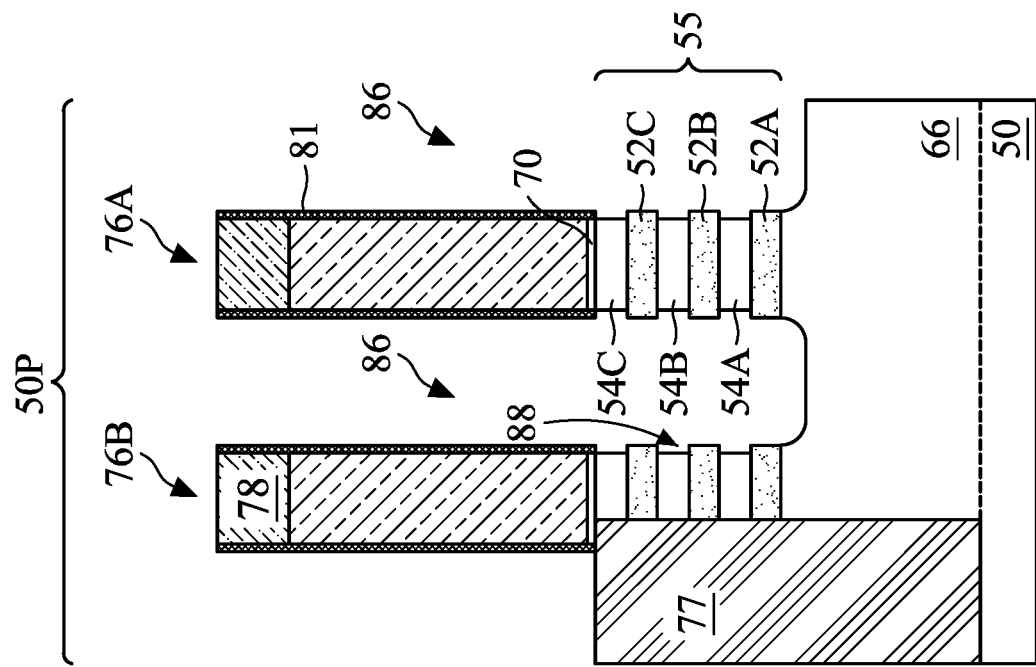
Figure 12:
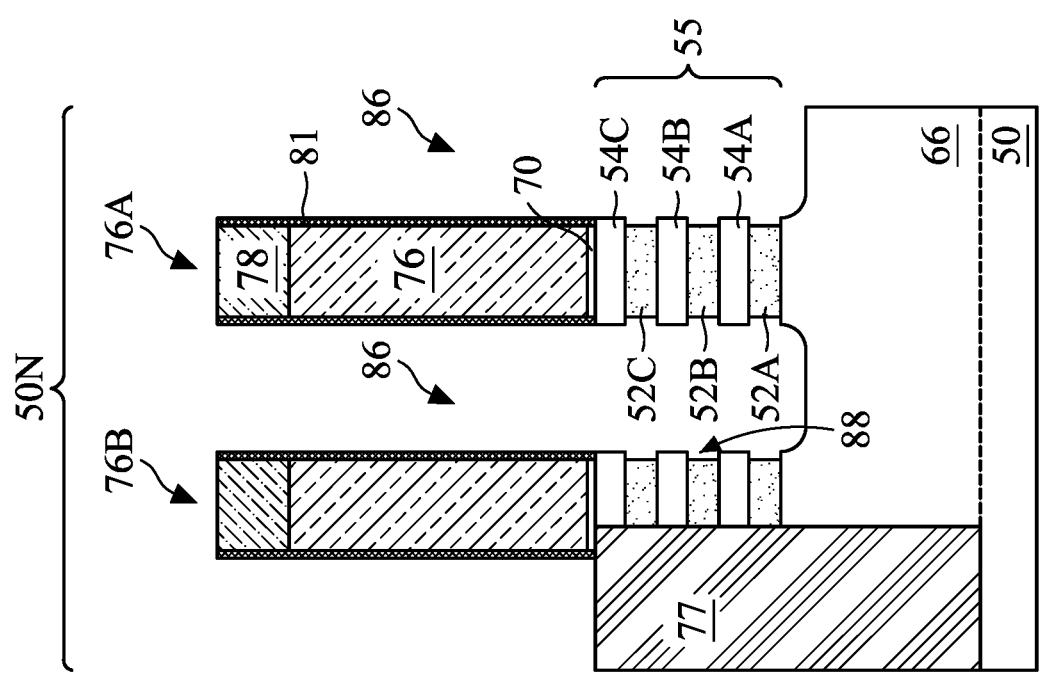

In FIG. 12, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the n-type region 50N. Although sidewalls of the first nanostructures 52 and the second nanostructures 54 in sidewall recesses 88 are illustrated as being straight in FIG. 12B, the sidewalls may be convex or concave. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

Figure 13:
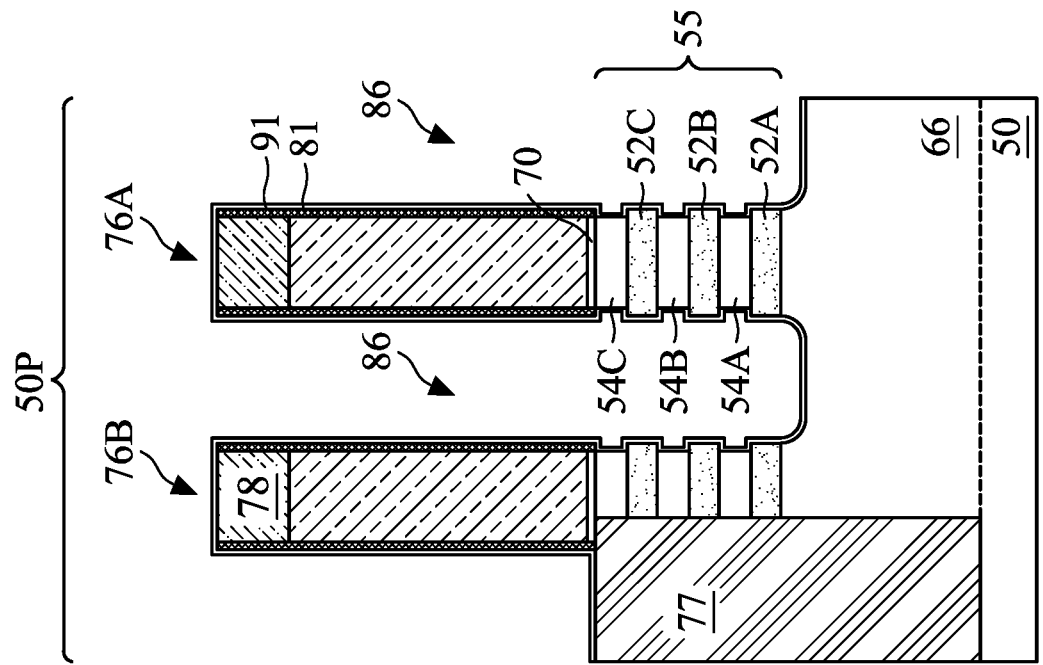
Figure 13:
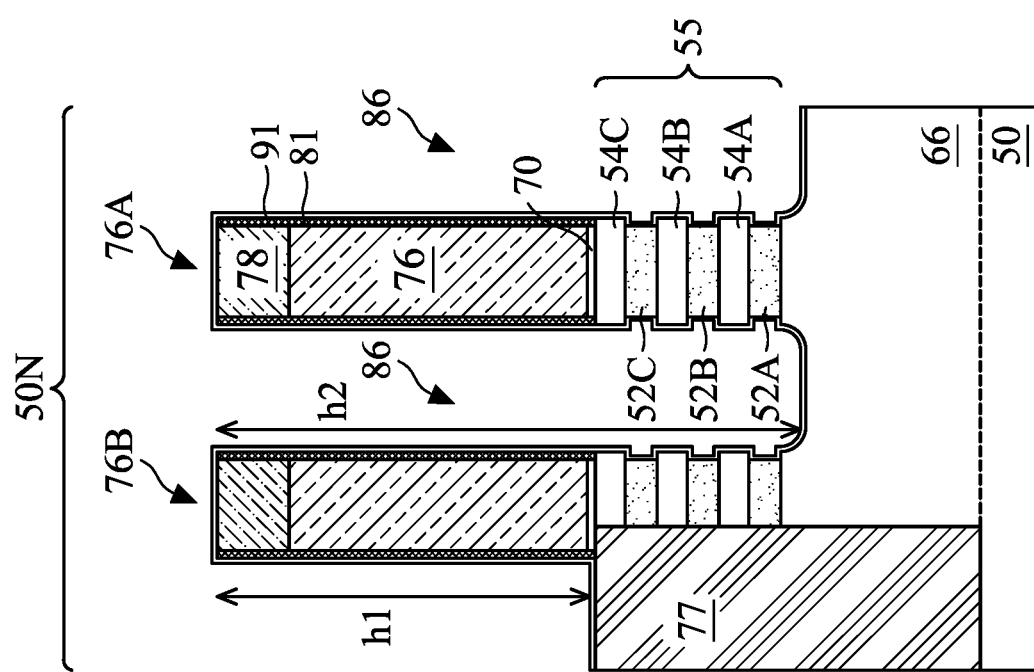

In FIG. 13, a first inner spacer layer 91 is formed over the boundary structure 77, over the dummy gates 76, along sidewalls of the dummy gates 76, and in the first recesses 86, including in the sidewall recesses 88. The first inner spacer layer 91 may deposited over the structures illustrated in FIG. 12. The first inner spacer layer 91 will be used to form inner spacers which act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The first inner spacer layer 91 may be deposited by a conformal deposition process, such as CVD, ALD, or the like to a thickness between about 0.2 nm and 5 nm. The conformity of deposition may be between about 50% and 99%. The first inner spacer layer 91 may comprise a material including a combination of Si, Al, C, O, N, Ge, B, P, Hf, La, Zr, and Ba. For example, the first inner spacer layer 91 may include a first insulating material, such as silicon oxide, silicon nitride, silicon oxynitride, silicon carbide, or silicon oxycarbonitride, or an insulating material that is an oxide or nitride of one or more of the preceding elements, e.g., geranium oxide, phosphorus oxide, barium oxide, boron oxide, aluminum oxide, lanthanum oxide, hafnium oxide, and zirconium oxide. In some embodiments, the first inner spacer layer 91 may include the first insulating material and one or more doping elements, such as boron, phosphorus, carbon, and the like, or combination thereof. In such embodiments, the doping of the first inner spacer layer 91 may be done in-situ during deposition of the first inner spacer layer 91 or may be done following deposition of the first inner spacer layer 91.

After depositing the material of the first inner spacer layer 91, the device could be cooled. As the device cools, the first inner spacer layer 91 will shrink due to its coefficient of thermal expansion (CTE). Because the first inner spacer layer 91 has a greater height h2 on one side of the dummy boundary gate 76B versus the height h1 on the other side of the dummy boundary gate 76B, as the first inner spacer layer 91 cools, an unbalanced compressive force on the dummy boundary gate 76B along the length of the height h2 is larger than the compressive force along the length of the height h1. This unbalanced compressive force can cause the dummy boundary gate 76B to tilt or bend toward the adjacent gate—in the direction of the recess 86. Embodiments counteract this unbalanced compressive force by adding a second inner spacer layer as described below.

Figure 14:
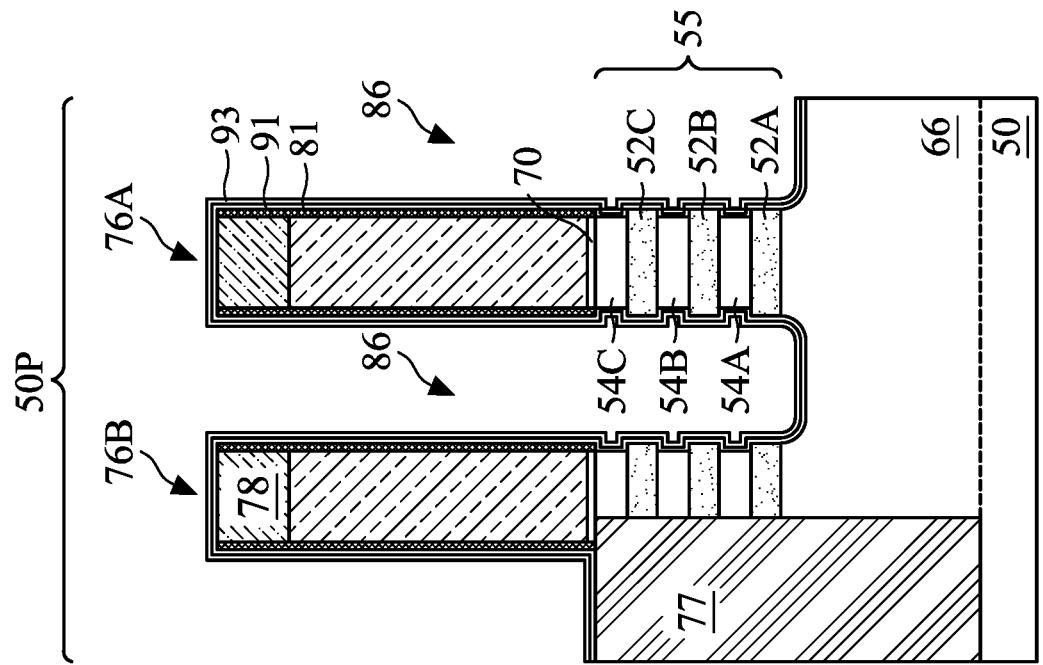
Figure 14:
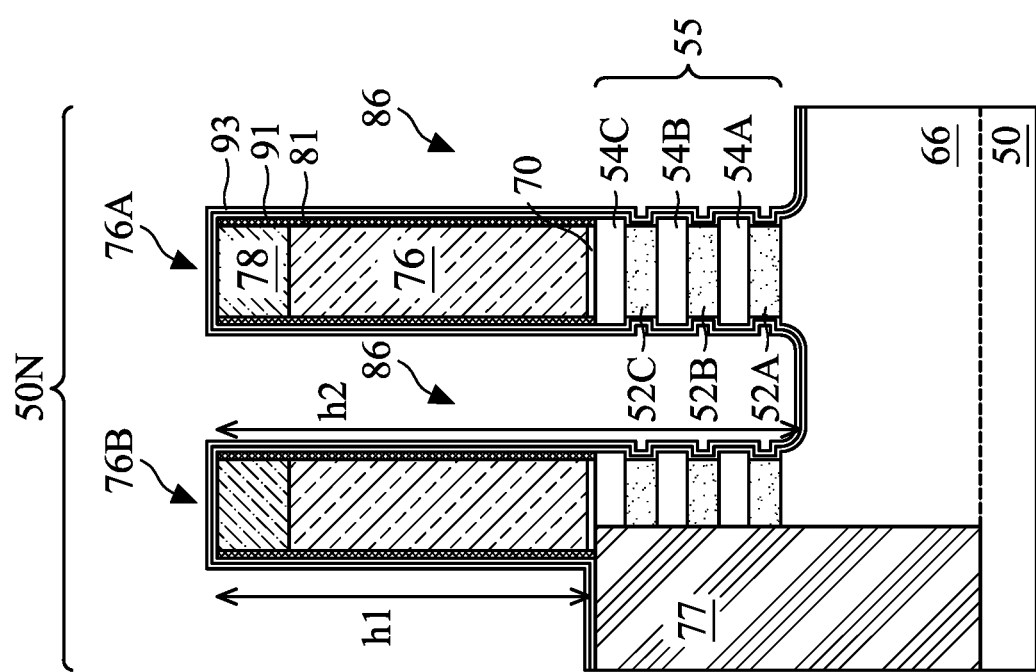

In FIG. 14, to counteract the stress exhibited by the first inner spacer layer 91, a second inner spacer layer 93 is deposited over the first inner spacer layer 91, immediately after forming the first inner spacer layer 91, before it has cooled from the deposition process of the first inner spacer layer 91. The second inner spacer layer 93 is adhered to the first inner spacer layer 91 all along its interface with the first inner spacer layer 91. When the device is cooled following deposition, due to the differences in CTE between the first inner spacer layer 91 and the second inner spacer layer 93, and that the second inner spacer layer 93 is adhered to the first inner spacer layer 91, the layer with the smaller CTE will provide a counteracting tensile force to the compressive force of the other layer. If, for example, the first inner spacer layer 91 has a CTE which is greater than the CTE of the second inner spacer layer 93, as the device cools, the first inner spacer layer 91 will want to contract more than the second inner spacer layer 93. However, because the two layers are adhered together, the first inner spacer layer 91 is prevented from contracting along the plane of the interface between the first inner spacer layer 91 and the second inner spacer layer 93. As a result, the first inner spacer layer 91 will put compressive strain on the second inner spacer layer 93 along the interface between the two. The second inner spacer layer 93 will counteract the compressive strain—fight against it—by exerting a tensile force or strain in the opposite direction as the compressive force or strain. If the tensile strength of the second inner spacer layer 93 is strong enough to withstand the compressive force, the dummy boundary gate 76B will not bend, however, if it is not strong enough to withstand the compressive force, the dummy boundary gate 76B will alter shape (bend or tilt) until the compressive force and tensile force are equalized. If the first inner spacer layer 91 has a CTE which is less than the CTE of the second inner spacer layer 93, then the relationships would be reversed—the second inner spacer layer 93 will put compressive strain on the first inner spacer layer 91 and the first inner spacer layer 91 will put tensile strain on the second inner spacer layer 93.

The second inner spacer layer 93 may be formed using processes and using candidate materials similar to those discussed above with respect to the first inner spacer layer 91. In some embodiments, the materials of the second inner spacer layer 93 may include different material elements than the materials of the first inner spacer layer 91, such as doping elements or combinations of different materials. In other embodiments, the materials of the second inner spacer layer 93 may include the same materials as the elements of the first inner spacer layer 91. In such embodiments, different CTEs may be achieved by using different concentrations of the materials. The second inner spacer layer 93 may also be formed to a thickness between 0.2 nm and 5 nm, though the thicknesses of the first inner spacer layer 91 and the second inner spacer layer 93 may be different from each other.

In particular, the second inner spacer layer 93 may be formed so that the CTE differences between the dummy gate 76C, the first inner spacer layer 91, and the second inner spacer layer 93 are controlled. In some embodiments, the first inner spacer layer 91 may have a CTE between about $1 \times 10^{-7}$/K and about $3 \times 10^{-5}$/K, and the second inner spacer layer 93 may have a CTE between about $1 \times 10^{-7}$/K and about $3 \times 10^{-5}$/K, The difference in CTE between the first inner spacer layer 91 and the second inner spacer layer 93 may be between about $1 \times 10^{-7}$/K and about $2 \times 10^{-6}$/K. If the difference in CTE is too small, the inner spacer layer with the lower CTE may not contribute enough tensile force to counter the compressive force of the inner spacer layer with the higher CTE, causing the dummy boundary gate 76B to bend. If the difference in CTE is too large, the inner spacer layer with the lower CTE may not have enough material tensile strength to withstand the compressive force, causing the dummy boundary gate 76B to bend. When the differences between the CTEs of the first inner spacer layers 91 and the second inner spacer layer 93 is between about $1 \times 10^{-7}$/K and about $2 \times 10^{-6}$/K, the bending (if any) may be within acceptable process variations. In some embodiments the ratio of the larger CTE to the smaller CTE of the first inner spacer layer 91 and the second inner spacer layer 93 may be between about 10:1 to about 10:9, to effectively reduce and/or eliminate bending of the dummy boundary gate 76B. If the CTEs are too close to each other, then the inner spacer layer with the lower CTE may not be able to provide enough tensile force to counterbalance the compressive force of the other layer. In other words, the material may not have enough tensile strength and it may bend. On the other hand, if the CTEs are too far apart from each other, the amount of tensile force provided by the inner spacer layer with the lower CTE may not be enough to prevent the dummy boundary gate from bending. In other words, the tensile strength of the dummy boundary gate will still not be enough to prevent the dummy gate from bending, even with the assistance of the second inner spacer layer. In some embodiments the thicknesses of each of the inner spacer layers may be configured to provide additional tensile or compressive strength. For example, if the ratio of the larger CTE to the smaller CTE is 10:1, the thickness of the layer with the smaller CTE can be increased to provide more tensile strength to counter the compressive force with tensile force without bending. For example, increasing the thickness of the layer with the smaller CTE relative to the layer with the larger CTE would also increase the available tensile force of the material with the smaller CTE.

The total in-plane strain for two adjacent films based on their CTEs is represented by the equation $\int_{T_0}^{T_{Max}}(\alpha_2-\alpha_1)dT$, where $\alpha_1$ is the CTE of the first film and $\alpha_2$ is the CTE of the second film, and dT is the change in temperature from $T_0$ to $T_{Max}$, a temperature range, for example, from 25° C. to 900° C. Thus, the in-plane strain can be reduced by including a second film with a different CTE. The first film (the one represented by the CTE $\alpha_2$) becomes compressive and the second film (the one represented by the CTE $\alpha_1$) becomes tensile with respect to the first film. It can therefore be seen that combining the first inner spacer layer 91 with the second inner spacer layer 93 reduces the effective strain on the dummy boundary gate 76B. Some of the total compressive force on the side of the dummy boundary gate 76B adjacent the recess 86 is also counteracted by the compressive force on the opposite side of the dummy boundary gate 76B. For example, the compressive force for the dummy gate 76A is balanced on both sides, however, the compressive force for the dummy boundary gate 76B is only partially offset by the opposite side (the boundary side). Essentially, the remaining compressive force for the dummy boundary gate 76B is based on the height difference h2–h1 (or the depth of the recesses 86).

Due to the reduced effective strain on the dummy boundary gate 76B given by the use of the first inner spacer layer 91 and the second inner spacer layer 93, the dummy boundary gate 76B can more likely withstand the compressive force which would tend to tilt or bend the dummy boundary gate 76B. The compressive force will always seek equilibrium with the tensile force. In the case of a single layer inner spacer layer, if the dummy boundary gate 76B cannot provide enough tensile strength (tensile counter-acting force) to withstand the compressive force, then it will tilt or bend until it reaches a point of equilibrium between the compressive force of the inner spacer layer and the tensile force of the dummy boundary gate 76B. In the disclosed embodiments utilizing the dual-layer inner spacer layer with different CTEs (as illustrated in FIG. 14), the second inner spacer layer provides a measure of tensile force to assist the dummy boundary gate 76B, i.e., reduce the amount of tensile force needed for the dummy boundary gate 76B to provide to counterbalance the compressive force. Thus, equilibrium between the compressive forces and tensile forces can be reached without the dummy boundary gate 76B tilting.

For example, the first inner spacer layer 91 may be silicon oxide, silicon nitride, silicon oxynitride, silicon carbide, or silicon oxycarbonitride and the second inner spacer layer 93 may be another oxide such as germanium oxide, phosphorus oxide, barium oxide, boron oxide, or aluminum oxide, or may be a nitride, such as silicon nitride, silicon carbonitride, or silicon oxynitride. If the thickness of the first inner spacer layer 91 is the same as the second inner spacer layer 93 as deposited, then their volumes are about equal as deposited. Silicon oxide has a CTE of about 0.65 $10^{-6}$/K. Taking silicon nitride as an example for the second inner spacer layer 93, silicon nitride has a CTE of about 2.9 $10^{-6}$/K. As the two layers cool, the silicon nitride will compress more than the silicon oxide, however, it is unable to do so in-plane with the silicon oxide because they are stuck together, resulting in an in-plane compressive force on the silicon oxide layer. The silicon oxide layer will provide an in-plane tensile force to counter the compressive force. The substrate (in this case the dummy electrode 76 of the dummy boundary gate 76B), will also provide a tensile force to counter the compressive force. If the tensile forces cannot equalize the compressive force, then the dummy boundary gate 76B will bend to compensate (i.e., reduce the compressive force by physically changing shape). If the tensile forces can equalize the compressive force, then the dummy boundary gate 76B will not bend. For example, when the temperature of the films as deposited is 250° C. and the structure is cooled to 100° C., then the realized percentage difference in volume for the silicon nitride layer after cooling is about 0.0435% (shrinkage) and the realized percentage difference in volume for the silicon oxide layer after cooling is about 0.00975%, a ratio of about 9:2. Process variation for temperature in depositions can vary greatly. As such, a more useful measure is the amount of cooling that occurs between deposition of the inner spacer layers (91 and 93) and the subsequent etching of the inner spacer layers to form the inner spacers (see FIGS. 16 and 17). In some embodiments, the amount of cooling may be between 50° C. and 300° C., though other values are contemplated and may be used. The greater amount of cooling, the more compressive force is exhibited by the inner spacer layer with the higher CTE.

The CTE of the silicon oxide layer may be increased or the CTE of the silicon nitride layer may be decreased by adding other materials to the films during or after deposition. For example, the CTE of the silicon nitride and/or silicon oxide may be increased or decreased by doping or adding a filler material to the films. In some embodiments, the first or second inner spacer layers 91 and 93 may be a insulating oxide or nitride and may be doped with one or more of Si, Al, C, Ge, B, P, Hf, La, Zr, or Ba. It should be understood that the materials discussed above are only examples, and any of the candidate materials may be used. In addition, either one of the first inner spacer layer 91 or second inner spacer layer 93 may be the compressive film (having the higher CTE). The candidate materials may be combined in any of the manners discussed above.

Figure 15:
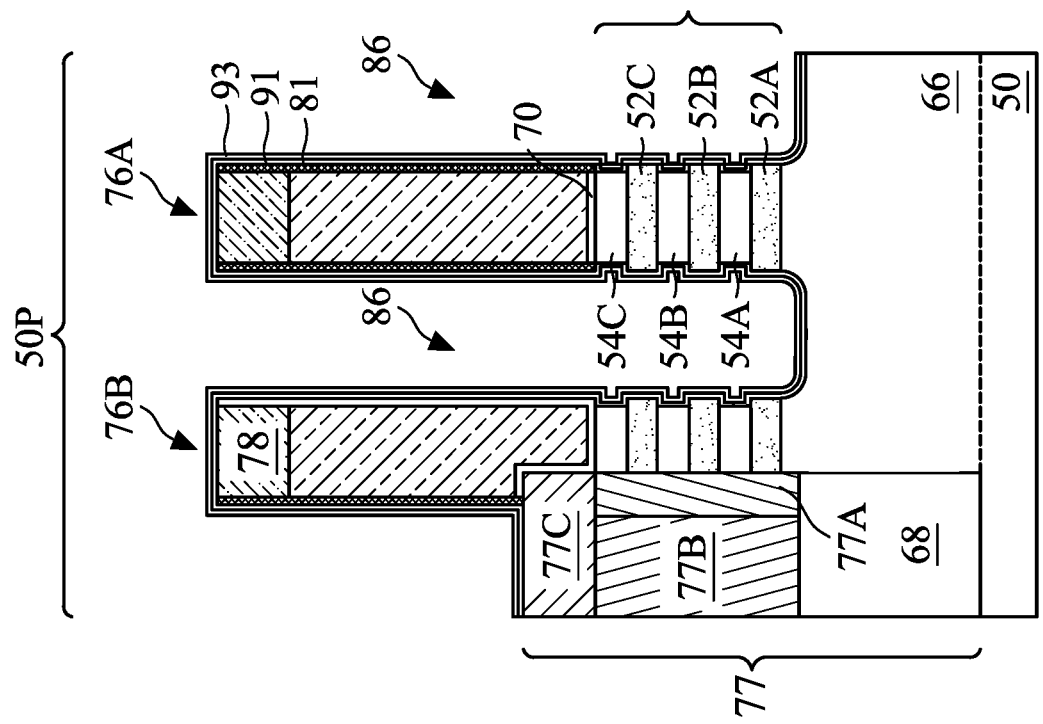

FIG. 15 illustrates several optional structures that have been mentioned in the above discussion The boundary structure 77, for example, may include the optional dielectric capping layer 77C, an optional liner 77A, the dielectric fill 77B, and may include a portion of the STI regions 68. In some embodiments utilizing the optional dielectric capping layer 77C, the dielectric capping layer 77C may protrude above the upper surfaces of the nanostructures 54, and may, in some embodiments, laterally protrude into the dummy boundary gate 76B. This may further shorten the height of the dummy boundary gate 76B on a side of the dummy boundary gate 76B opposite the recess 86. Due to the smaller height h3 as compared to h1, the inner spacer layers on the boundary side of the dummy boundary gate 76B do not provide as much counteracting compressive force for the longer recess side of the dummy boundary gate 76B.

Figure 16:
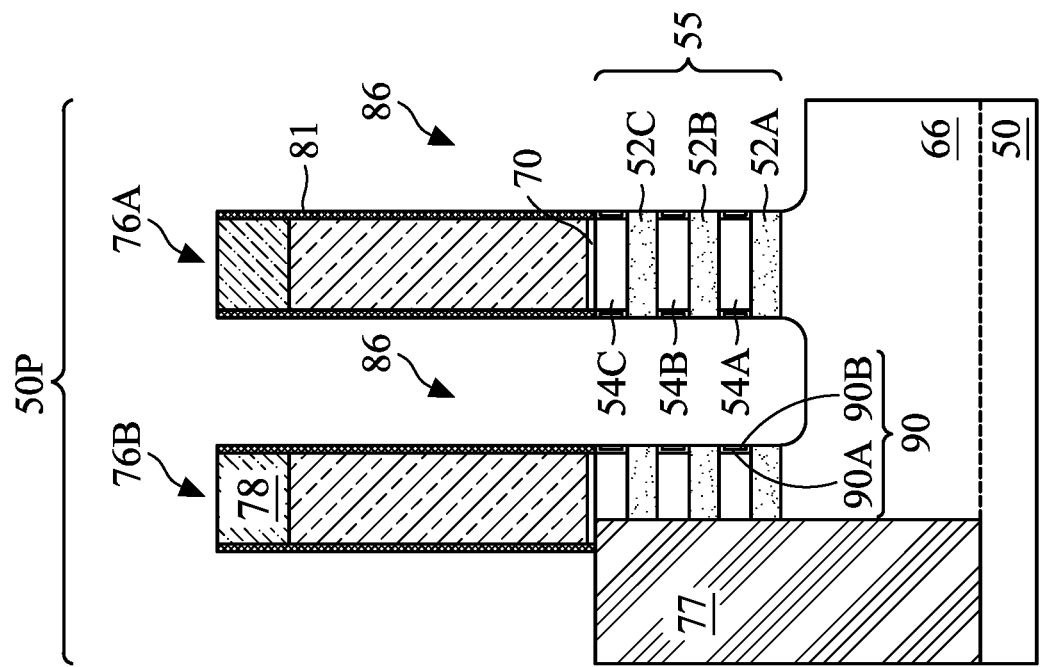
Figure 16:
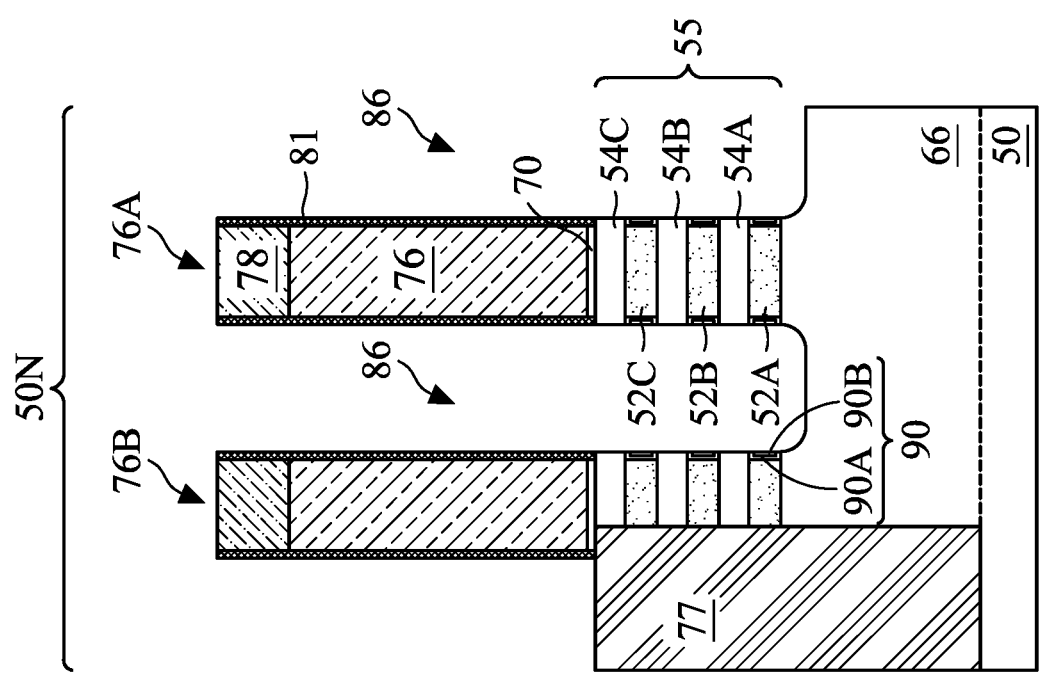
Figure 17:
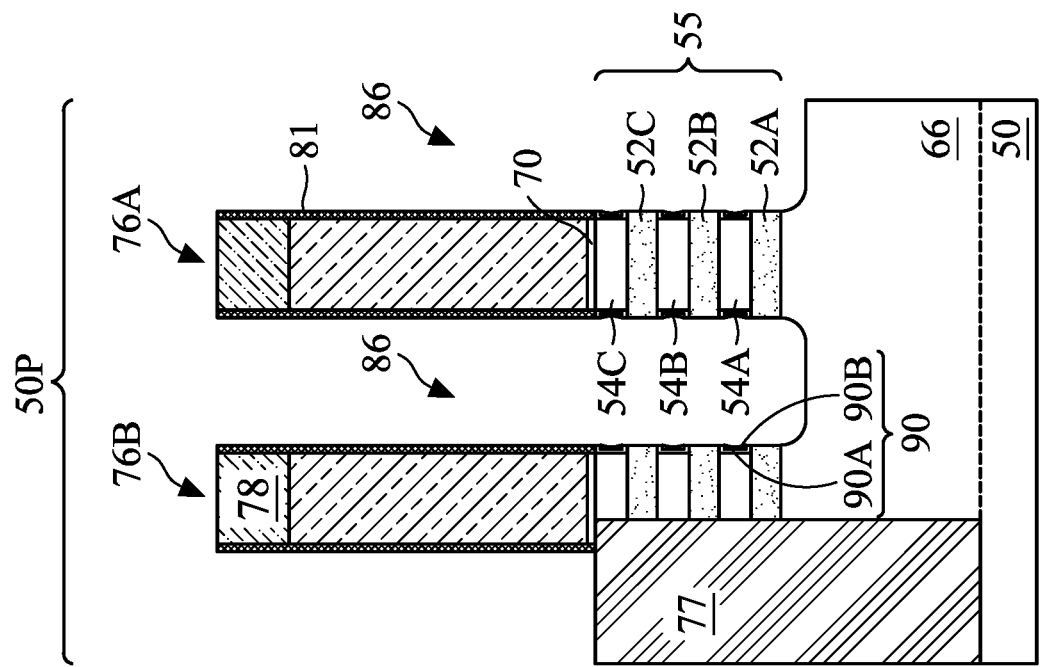
Figure 17:
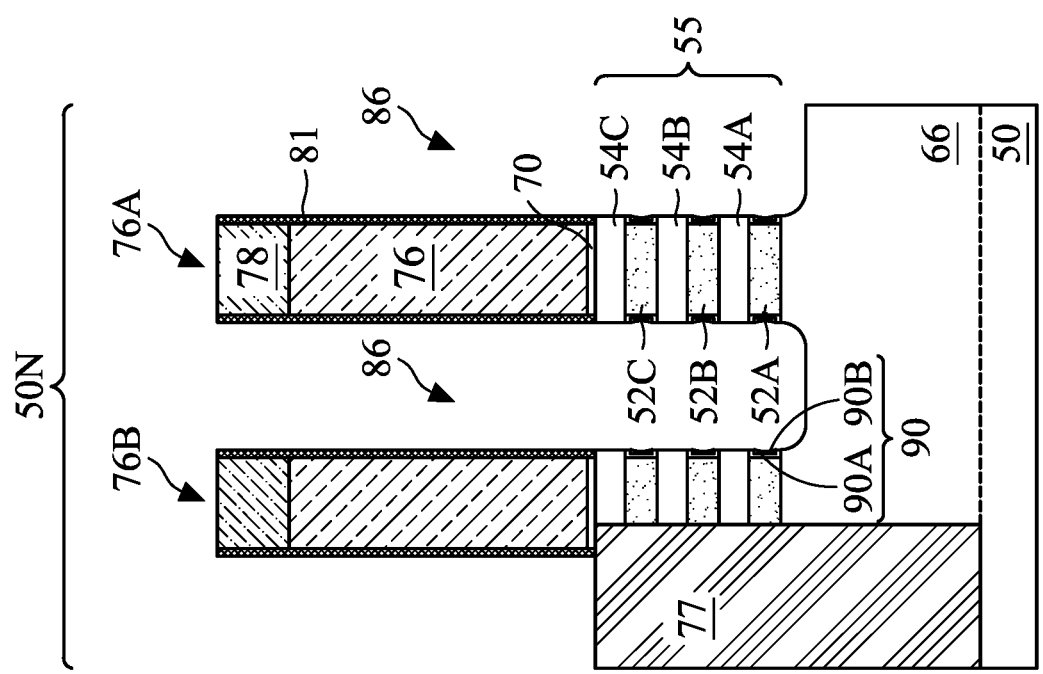

In FIGS. 16 and 17, the first inner spacer layer 91 and second inner spacer layer 93 inner spacer layer may be etched by an anisotropic etching process, such as RIE, NBE, or the like, to form the inner spacers 90A from the first inner spacer layer 91 and inner spacers 90B from the second inner spacer layer 93, together forming the first inner spacers 90.

The first inner spacers 90 may be used to prevent damage to subsequently formed source/drain regions (such as the epitaxial source/drain regions 92, discussed below with respect to FIGS. 18A-18C) by subsequent etching processes, such as etching processes used to form gate structures. FIG. 16 illustrates that in some embodiments the first inner spacers 90 may have straight sidewalls. FIG. 17 illustrates that, in some embodiments, the first inner spacers 90 may have a concave surface. In some embodiments, the second inner spacer layer 93 is a temporary structure and may be completely removed when etched, leaving the first inner spacers 90 being comprised only of the material of the first inner spacer layer 91 (only inner spacers 90A remaining).

Following the formation of the first inner spacers 90, because a first inner spacer layer 91 and a second inner spacer layer 93 are both used to counterbalance the film strain, the tops of the dummy boundary gate 76B are not tilted or bent at the boundary structure 77. The first inner spacers 90 include the inner spacers 90A and inner spacers 90B. The material composition for each of the inner spacers 90A and the inner spacers 90B may be different, as described above for the first inner spacer layer 91 and the second inner spacer layer 93. Also the CTE of the inner spacers 90A and the CTE of the inner spacers 90B may be different from one another, also as described above with respect to the first inner spacer layer 91 and the second inner spacer layer 93.

It may be possible to measure the CTE of the inner spacers 90A and the inner spacers 90B directly, however, in some embodiments, the CTE of the inner spacers 90A and inners spacers 90B may be measured by comparison to the same material of each, respectively, deposited on a blank substrate (such as a carrier substrate or bulk semiconductor substrate). For example, an elemental measurement tool may be used to determine a chemical material composition of each of the inner spacer 90A and the inner spacer 90B. Then, for each of the inner spacer 90A and 90B, the corresponding chemical material composition may be deposited on a blank substrate and the CTE determined for the deposited material composition. The CTE of the corresponding inner spacer 90A or 90B may be determined to be about the same as the CTE of the corresponding chemical material composition. For example, if an elemental analysis determines that the chemical composition of the inner spacer 90A is silicon oxide, a layer of silicon oxide may be deposited on a blank substrate and the CTE measured. Similarly, if an elemental analysis determines that the chemical composition of the inner spacer 90B is aluminum oxide doped with silicon, then a layer of aluminum oxide doped with silicon can be deposited on a blank substrate and the CTE measured.

Figure 18A:
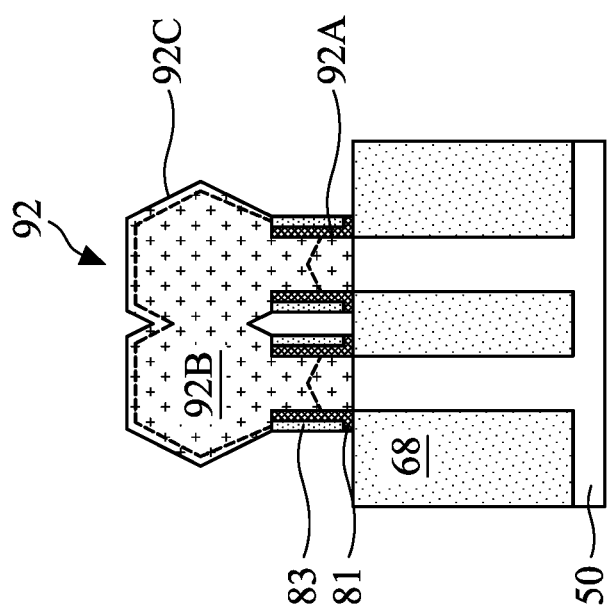
Figure 18B:
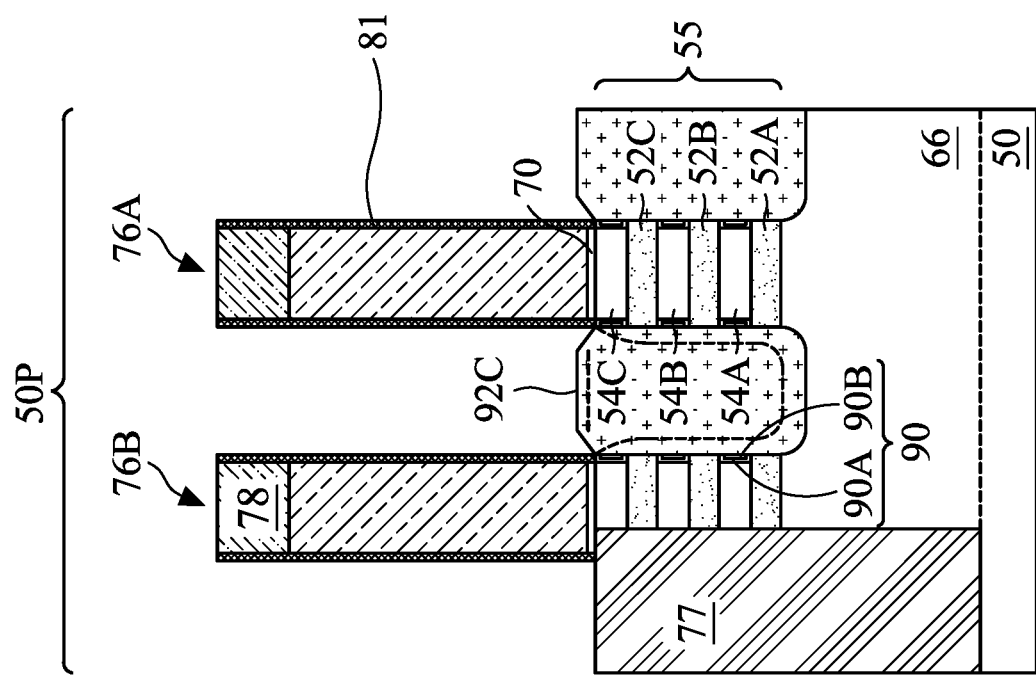
Figure 18B:
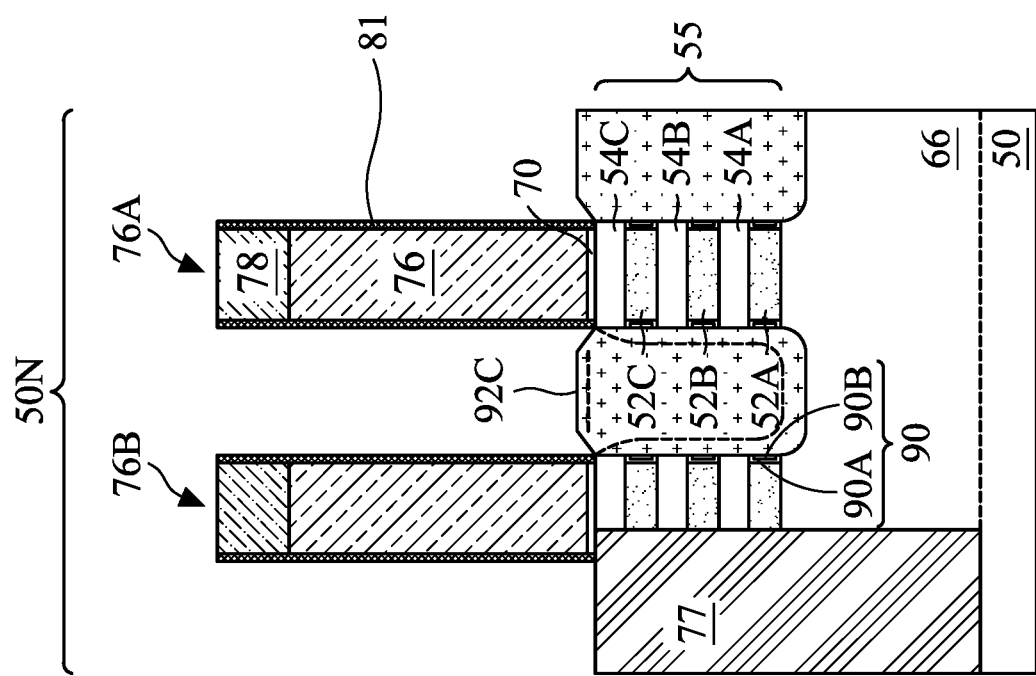
Figure 18C:
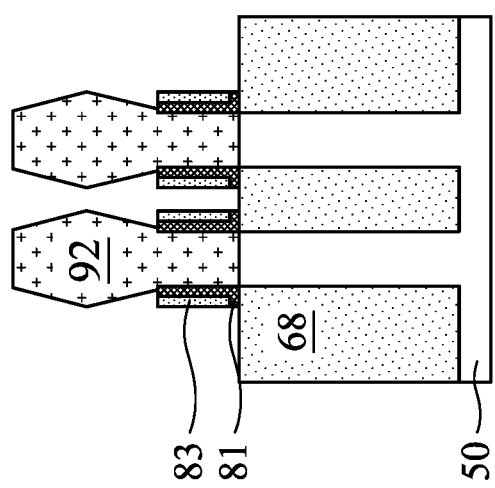

In FIGS. 18A, 18B, and 18C, epitaxial source/drain regions 92 are formed in the first recesses 86. In some embodiments, the source/drain regions 92 may exert stress on the second nanostructures 54 in the n-type region 50N and on the first nanostructures 52 in the p-type region 50P, thereby improving performance. As illustrated in FIG. 18B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 18A. In other embodiments, adjacent epitaxial source/drain regions 92 remain separated after the epitaxy process is completed as illustrated by FIG. 18C.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 19A:
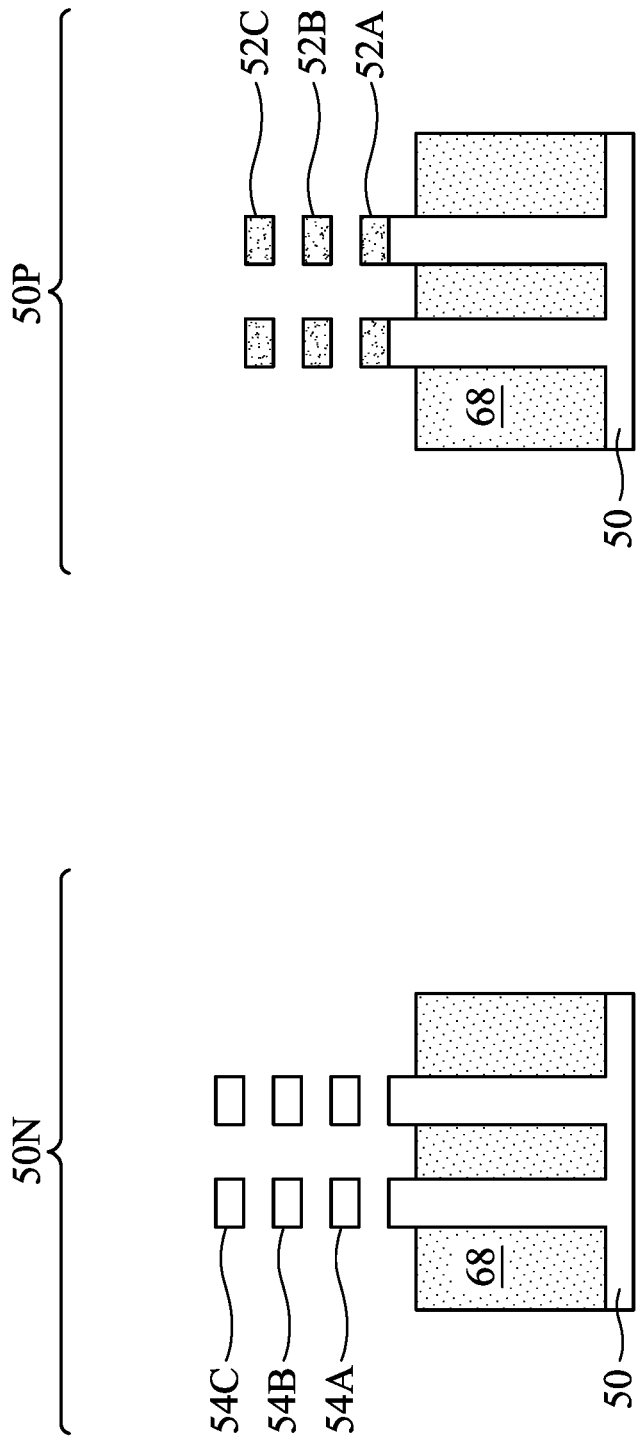
Figure 19B:
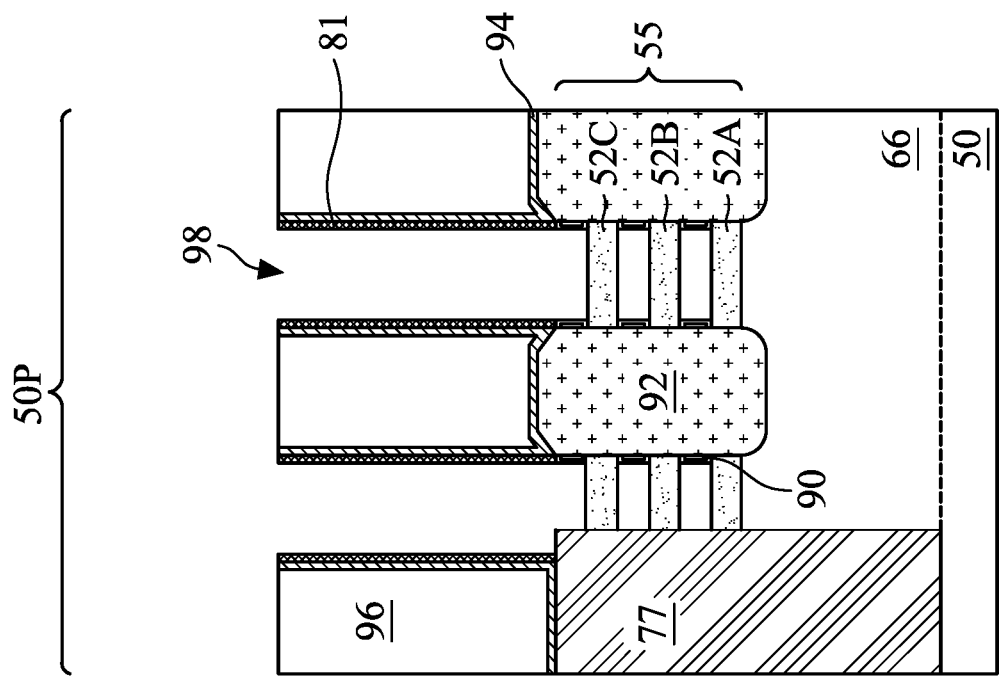
Figure 19B:
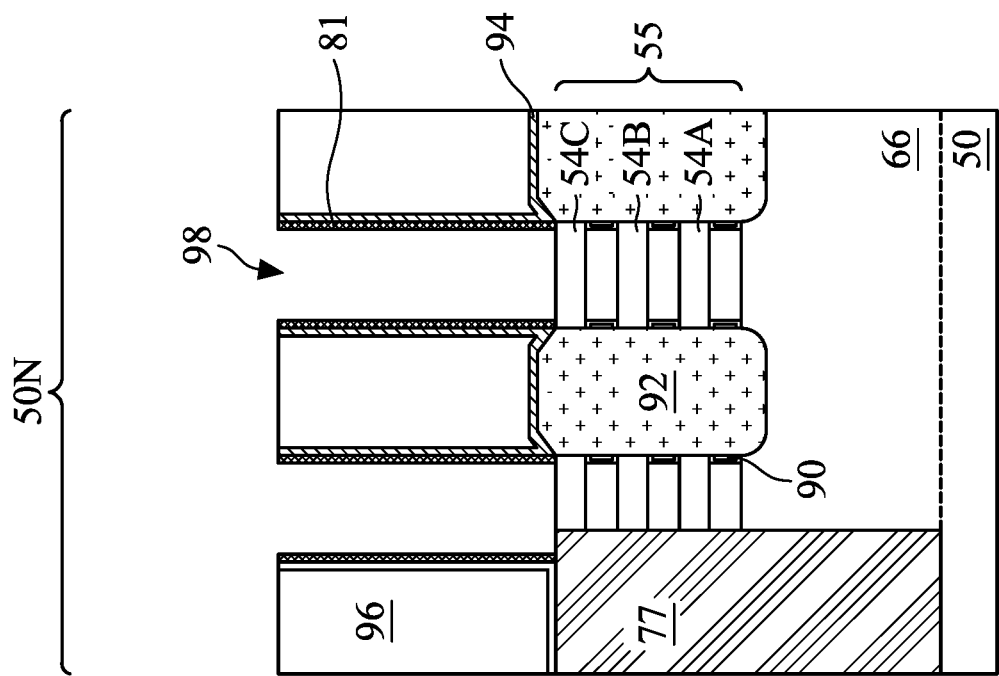

In FIGS. 19A and 19B, a first interlayer dielectric (ILD) 96 is deposited over the structure illustrated in FIGS. 18A and 18B. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Next, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Then, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Next, the first nanostructures 52 in the n-type region 50N and the second nanostructures 54 in the p-type region 50P are removed extending the second recesses 98. Notably, the first nanostructures 52 and/or second nanostructures 54 adjacent to the boundary structure 77 are also removed. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETs may have a same material composition, such as silicon, silicon germanium, or the like. FIGS. 22A, 22B, and 22C illustrate a structure resulting from such embodiments where the channel regions in both the p-type region 50P and the n-type region 50N are provided by the second nanostructures 54 and comprise silicon, for example.

Figure 20A:
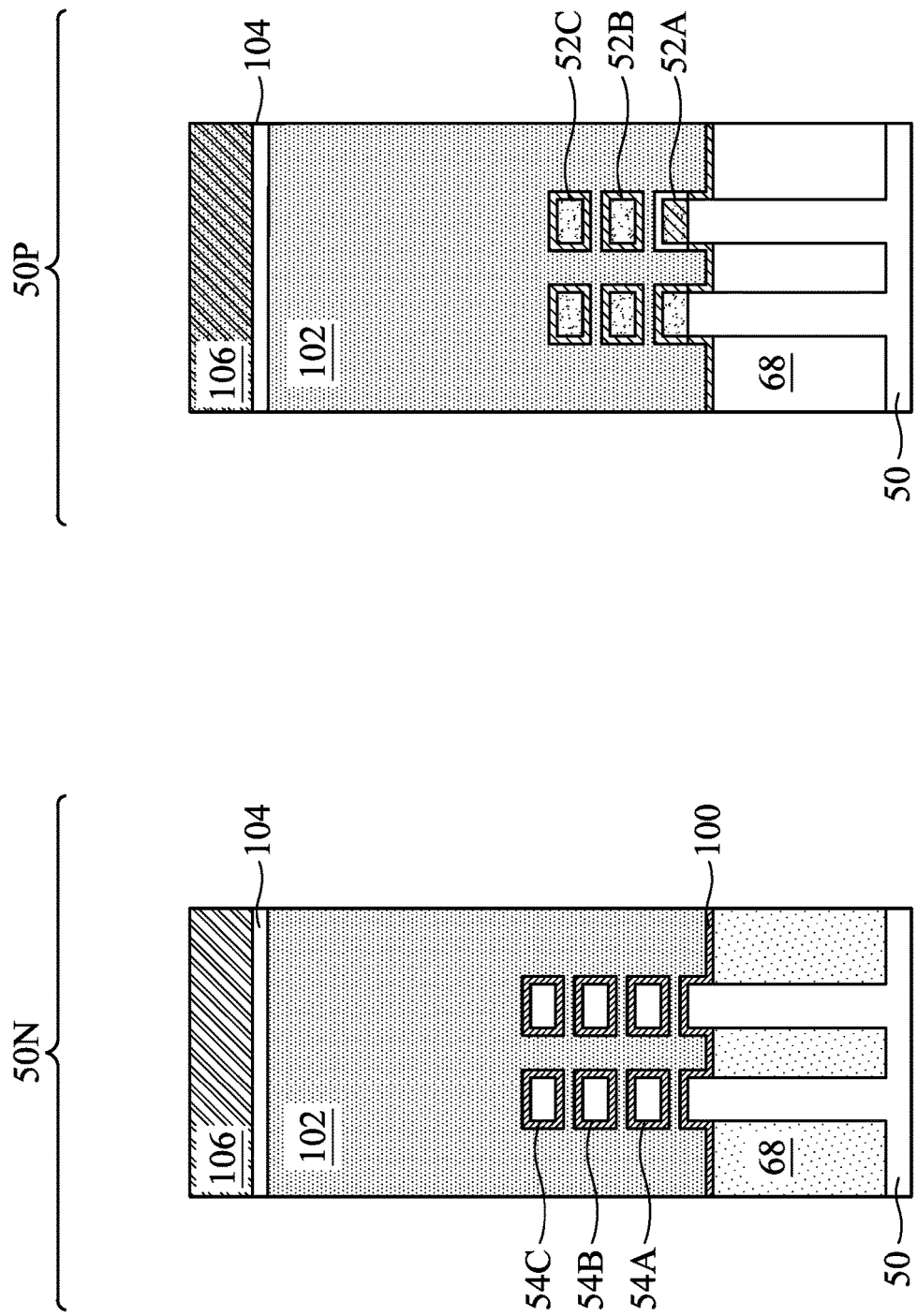
Figure 20B:
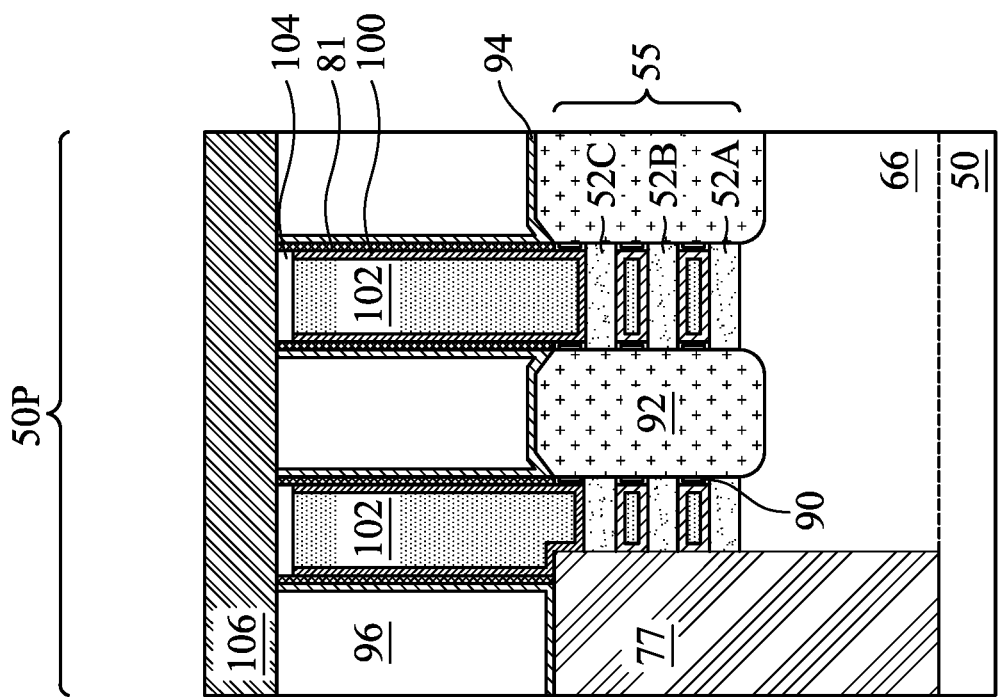
Figure 20B:
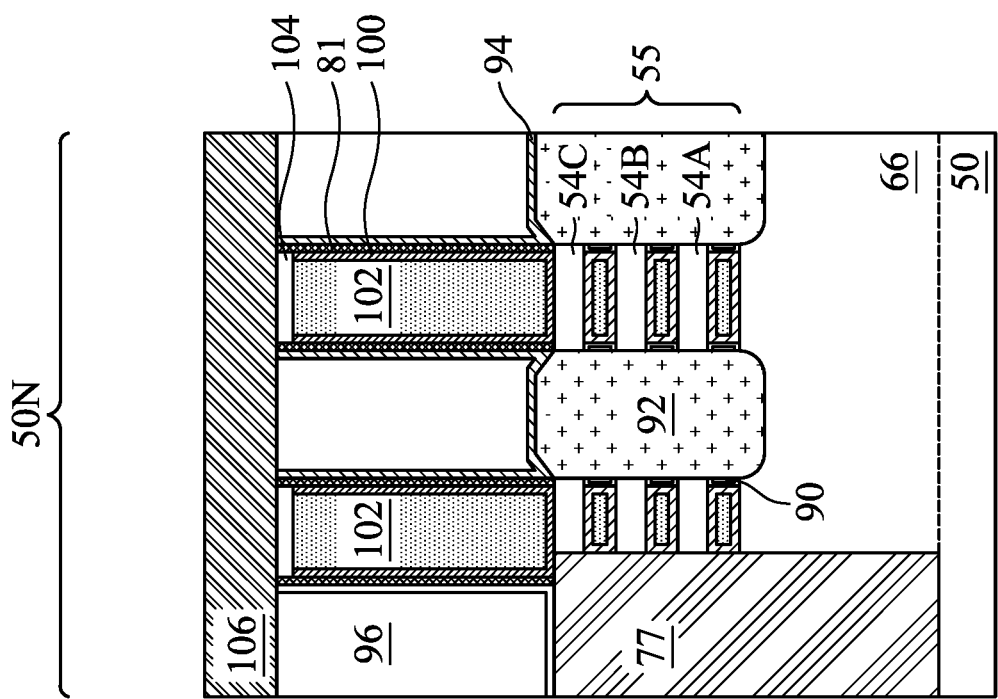
Figure 20C:
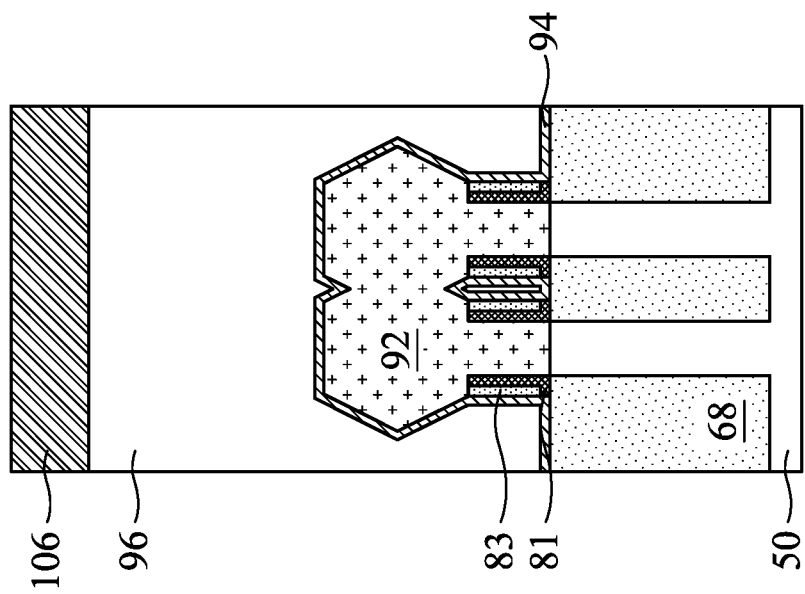

In FIGS. 20A, 20B, and 20C, gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52, and along the first inner spacers 90. The gate dielectric layers 100 may also be deposited on top surfaces of the first ILD 96, the CESL 94, the first spacers 81, and the STI regions 68. Although the dummy boundary gate 76B also has its dummy gates 76 removed and replaced, the resulting replacement gate is an inactive gate.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 20A and 20B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

The gate structure (including the gate dielectric layers 100 and the corresponding overlying gate electrodes 102) is then recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts penetrate through the gate mask 104 to contact the top surface of the recessed gate electrodes 102.

Next, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 21A:
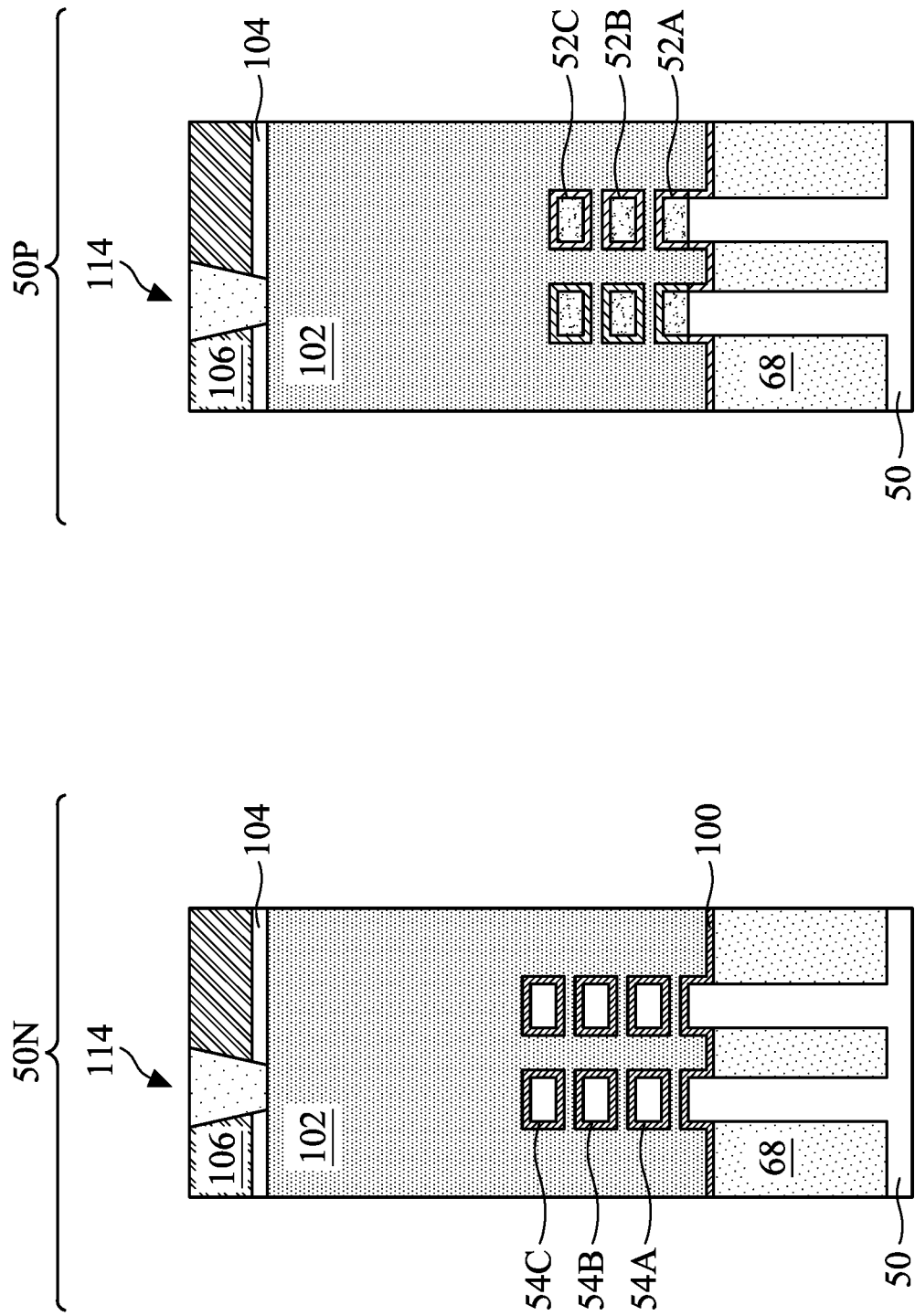
Figure 21B:
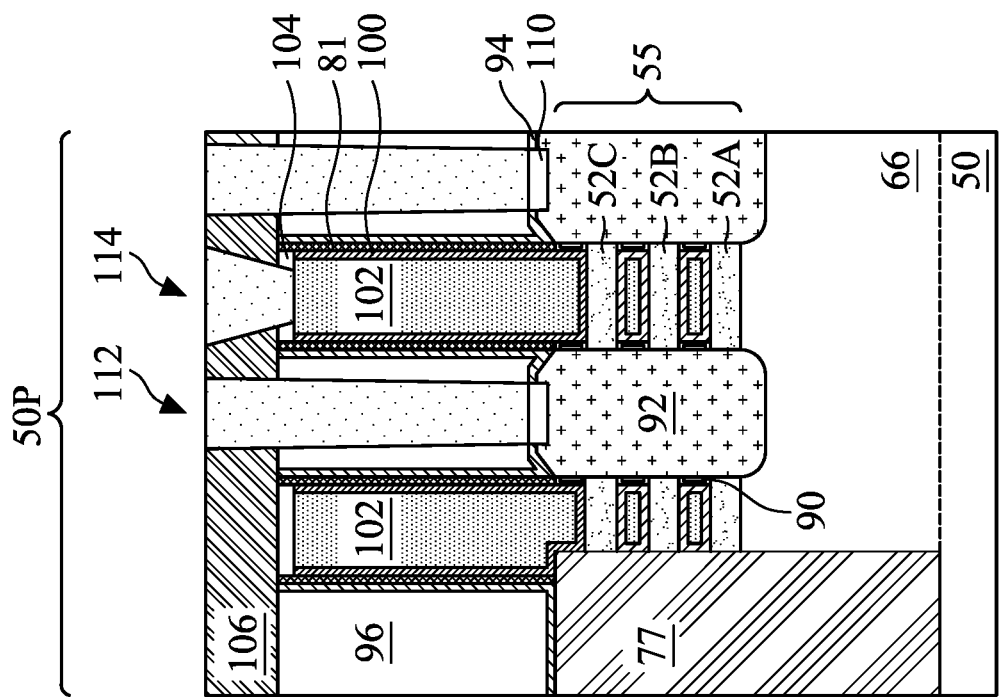
Figure 21B:
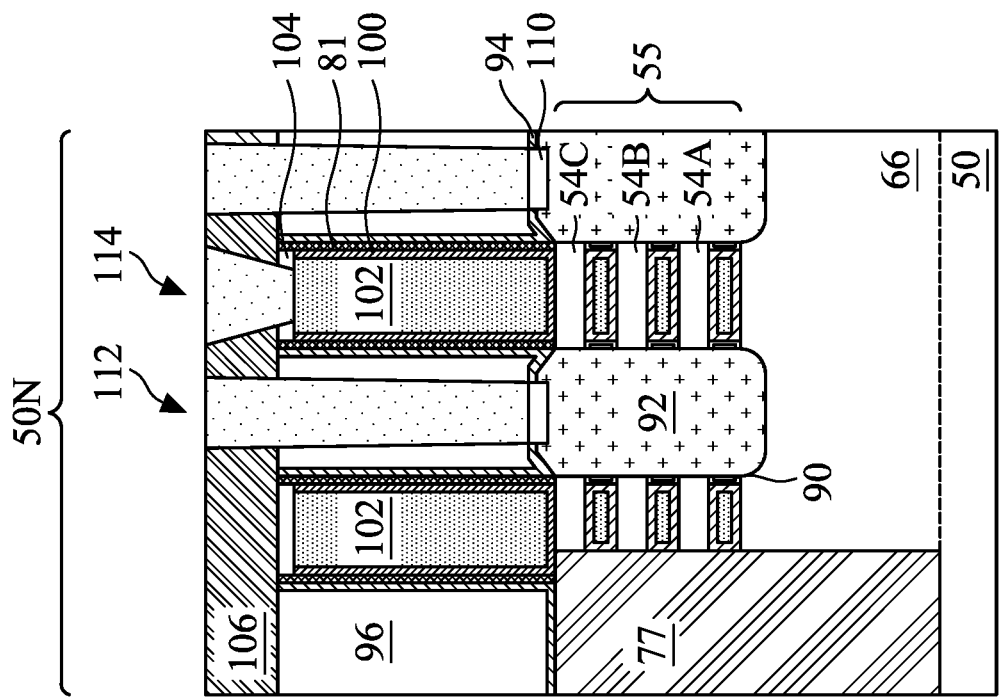
Figure 21C:
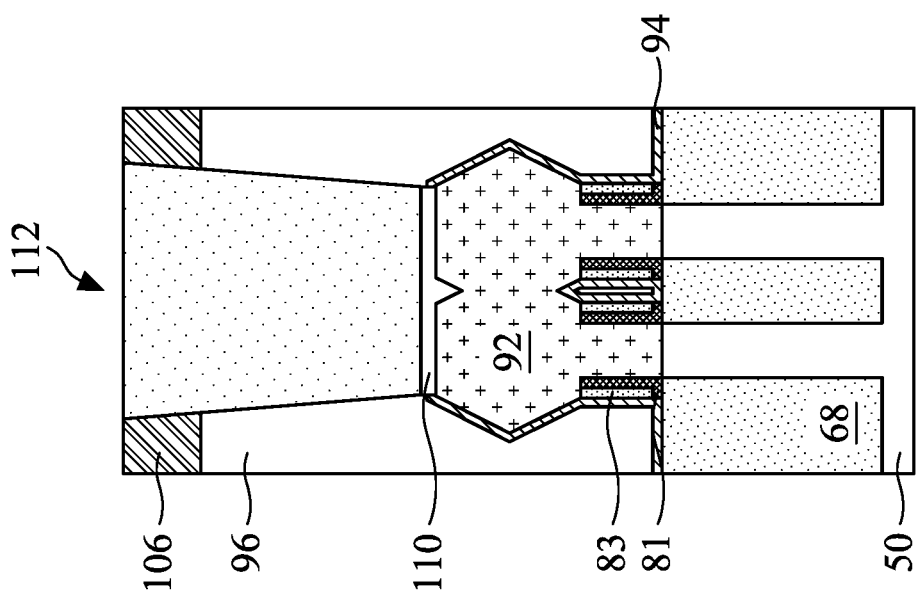
Figure 22A:
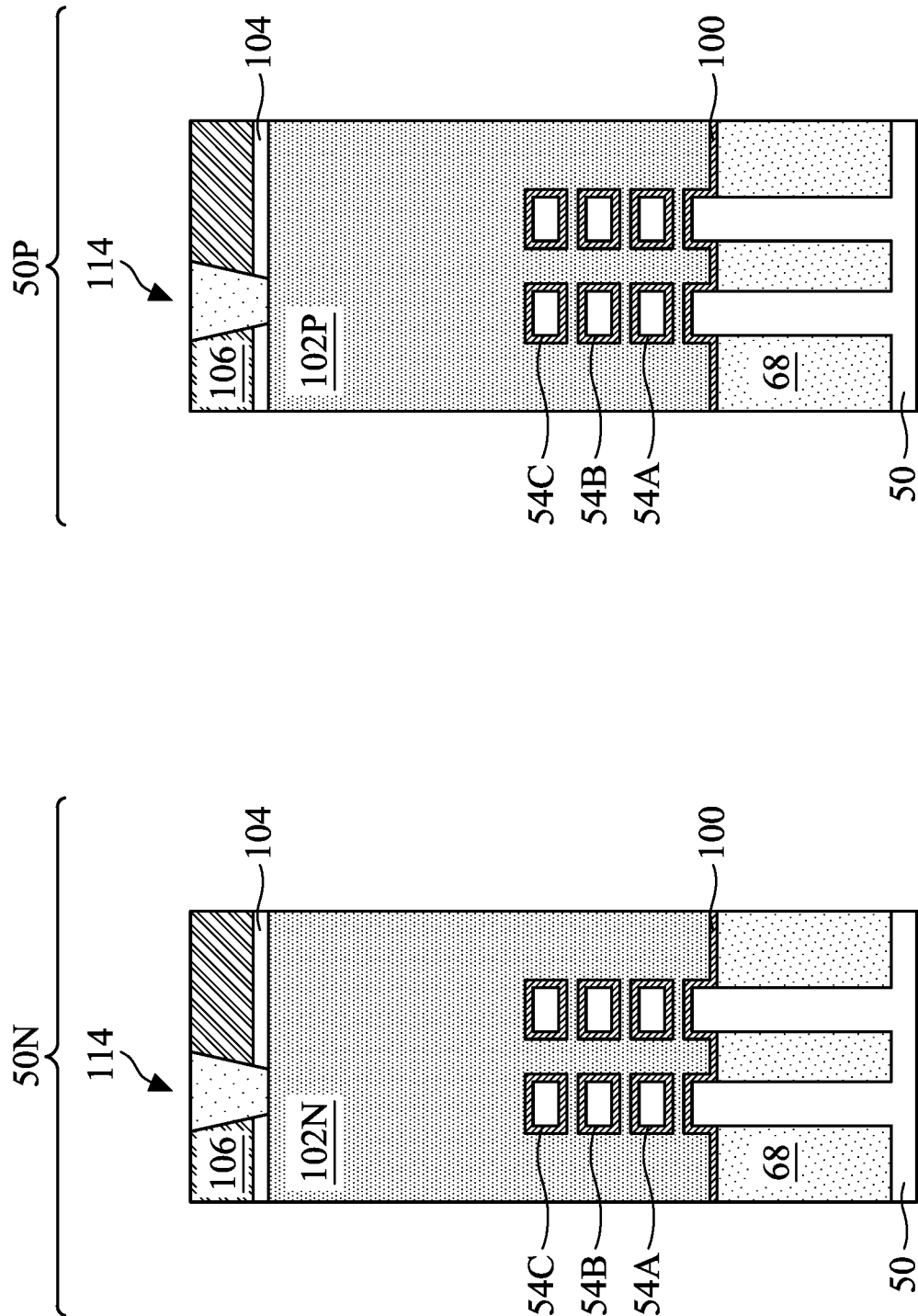
FIGS. 22A, 22B, and 22C are cross-sectional views of a nano-FET, in accordance with some embodiments.
Figure 22B:
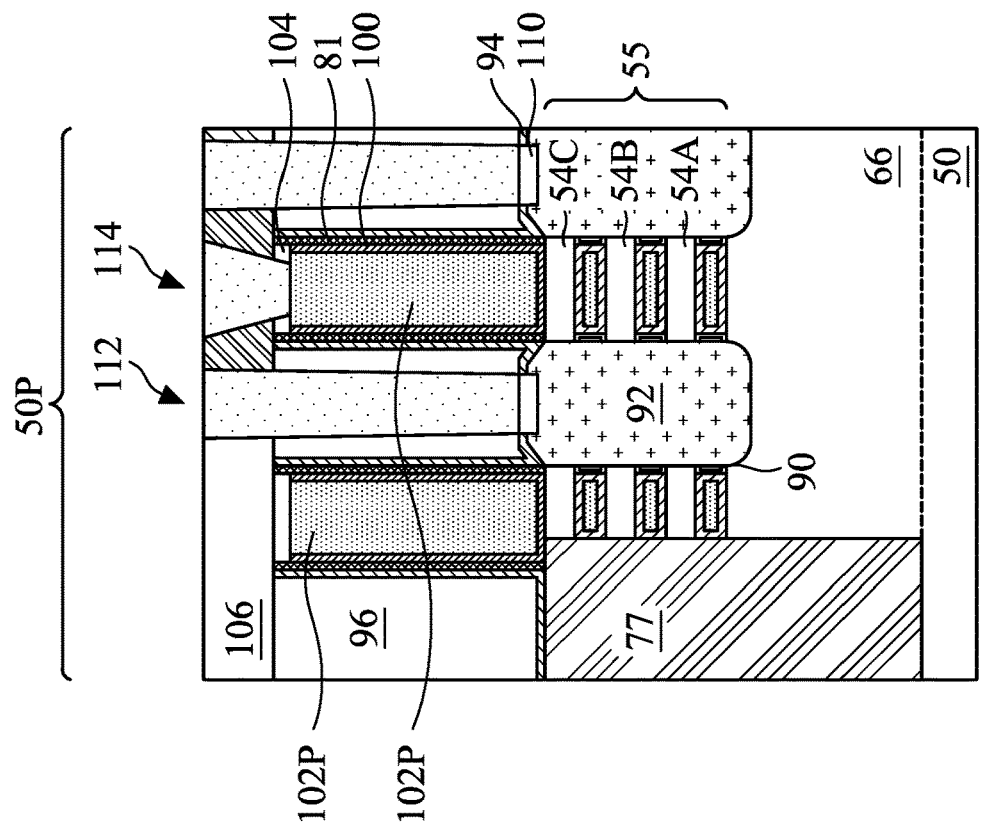
Figure 22B:
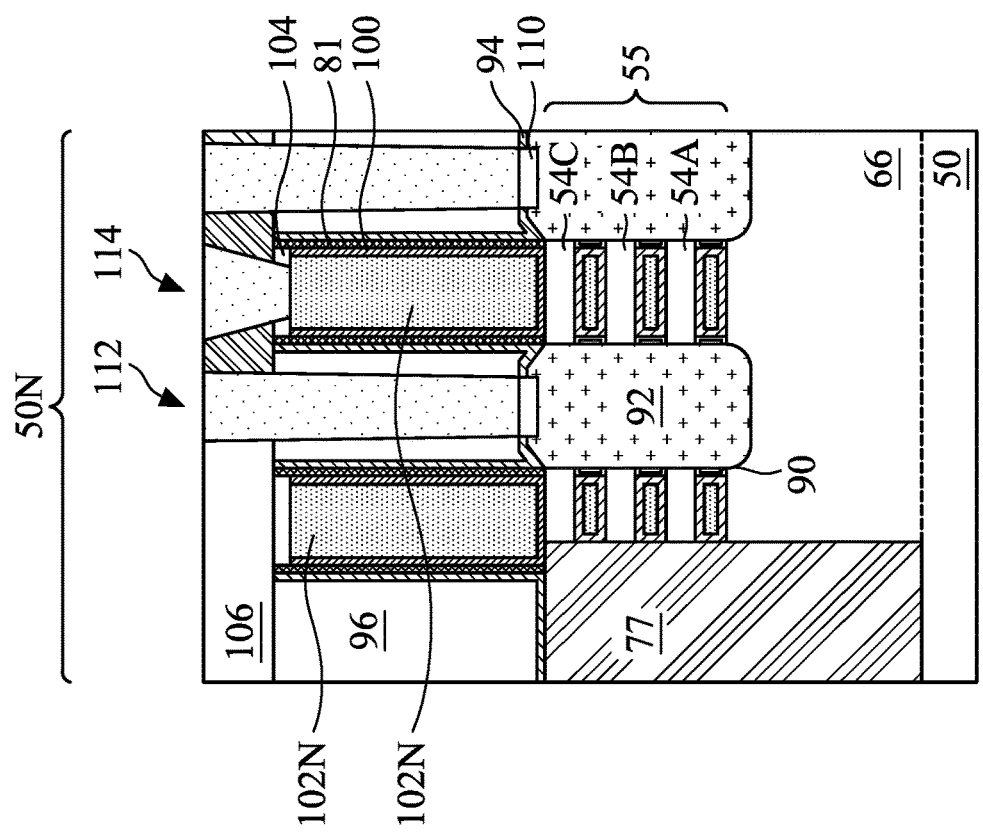
Figure 22C:
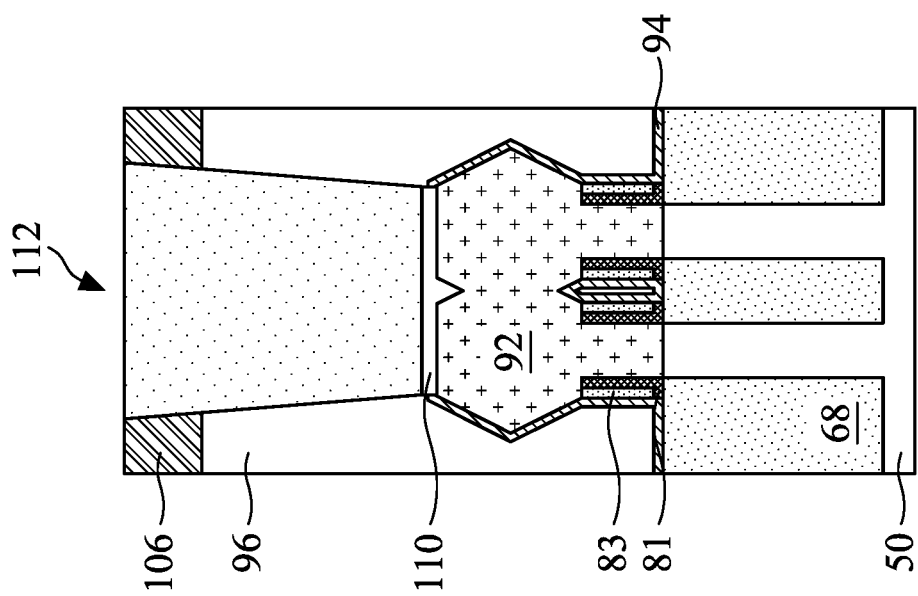

In FIGS. 21A, 21B, and 21C, the second ILD 106, the first ILD 96, the CESL 94, and the gate masks 104 are etched to form third recesses exposing surfaces of the epitaxial source/drain regions 92 and/or the gate structure. The third recesses may be formed by etching using an anisotropic etching process, such as RIE, NBE, or the like. In some embodiments, the third recesses may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses extend into the epitaxial source/drain regions 92 and/or the gate structure, and a bottom of the third recesses 108 may be level with (e.g., at a same level, or having a same distance from the substrate), or lower than (e.g., closer to the substrate) the epitaxial source/drain regions 92 and/or the gate structure. Although FIG. 21B demonstrates that the third recesses to the epitaxial source/drain regions 92 and to the gate structure would be in the same cross section, in various embodiments, the third recesses to the epitaxial source/drain regions 92 and the third recesses to the gate structure may be in different cross-sections, thereby reducing the risk of shorting subsequently formed contacts.

After the third recesses are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Next, contacts 112 and 114 (may also be referred to as contact plugs) are formed in the third recesses. The contacts 112 and 114 may each comprise one or more layers, such as barrier layers, diffusion layers, and fill materials. For example, in some embodiments, the contacts 112 and 114 each include a barrier layer and a conductive fill material, and is electrically coupled to the underlying conductive feature (e.g., gate electrodes 102 and/or silicide region 110 in the illustrated embodiment). The contacts 114 are electrically coupled to the gate electrodes 102 and may be referred to as gate contacts, and the contacts 112 are electrically coupled to the silicide regions 110 and may be referred to as source/drain contacts. The barrier layer for the contacts 112 and 114 may include titanium, titanium nitride, tantalum, tantalum nitride, or the like. The conductive fill material for the contacts 112 and 114 may be copper, a copper alloy, silver, gold, tungsten, cobalt, aluminum, nickel, or the like. A planarization process, such as a CMP, may be performed to remove excess material from a surface of the second ILD 106. Notably, contacts are not formed to the inactive gate disposed proximate the boundary structure 77.

FIGS. 22A, 22B, and 22C illustrate cross-sectional views of a device according to some alternative embodiments. FIG. 22A illustrates reference cross-section A-A' illustrated in FIG. 1. FIG. 22B illustrates reference cross-section B-B' illustrated in FIG. 1. FIG. 22C illustrates reference cross-section C-C' illustrated in FIG. 1. In FIGS. 22A, 22B, and 22C, like reference numerals indicate like elements formed by like processes as the structure of FIGS. 21A, 21B, and 21C. However, in FIGS. 22A, 22B, and 22C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 30A-30C may be formed, for example, by removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Embodiments achieve several advantages. Utilizing two distinct inner spacer layers provides additional tensile force to counterbalance compressive forces caused by having an unbalanced inner spacer layer deposition. Because a recess for the source/drain regions is formed adjacent one side of the boundary dummy gate and not the other side of the boundary dummy gate, the heights of the inner spacer layer on each side of the boundary dummy gate are different. As a result, a single inner spacer layer can exhibit greater strain on one side of the boundary dummy gate, causing it to bend. Embodiments utilize a second inner spacer layer which has a lower CTE than the first inner spacer layer and therefore provides tensile stress to oppose the compressive stress of the higher CTE film. The tensile stress counters the compressive stress so that the boundary dummy gate does not bend.

One embodiment includes a method including forming a first fin protruding from a substrate, the first fin including a second nanostructure over a first nanostructure. The method also includes forming an insulating structure laterally surrounding the first fin. The method also includes removing a portion of the first fin and forming a boundary structure in the first fin. The method also includes forming a dummy gate over the first fin, the dummy gate overlapping an edge of the boundary structure. The method also includes etching a recess in the first fin adjacent the dummy gate, the recess exposing the first nanostructure and the second nanostructure. The method also includes etching a sidewall recess in the first nanostructure. The method also includes depositing a first inner spacer layer over the dummy gate, in the recess, and in the sidewall recess, the first inner spacer layer having a first coefficient of thermal expansion (CTE). The method also includes depositing a second inner spacer layer over the dummy gate, in the recess, and in the sidewall recess, the second inner spacer layer having a second CTE. The method also includes cooling the first inner spacer layer and the second inner spacer layer. The method also includes and etching the first inner spacer layer and the second inner spacer layer to form a first inner spacer and a second inner spacer in the sidewall recess.

In an embodiment, the CTE of the first inner spacer layer is less than the CTE of the second inner spacer layer, where after cooling the first inner spacer layer and the second inner spacer layer, the second inner spacer layer provides a compressive force on the dummy gate and the first inner spacer layer provides a tensile force on the dummy gate. In an embodiment, the second inner spacer layer is deposited before the first inner spacer layer. In an embodiment, a ratio of the first CTE to the second CTE is between 1:10 and 9:10. In an embodiment, the method further includes doping the first inner spacer layer with a first dopant. In an embodiment, a material of the first inner spacer layer prior to doping is the same as a material of the second inner spacer layer. In an embodiment, the first inner spacer and the second inner spacer include an insulating material including an insulating oxide or nitride including zero or more of Si, Al, C, Ge, B, P, Hf, La, Zr, or Ba.

Another embodiment is a method including etching a first recess in a first nanostructure and a second nanostructure, the second nanostructure over the first nanostructure, the first recess disposed at a first side of a gate stack, a boundary structure disposed at a second side of the gate stack, the second side opposite the first side. The method also includes etching, through the first recess, sidewalls of the first nanostructure to form a sidewall recess of the first nanostructure. The method also includes depositing a sidewall spacer layer structure in the sidewall recess and over the gate stack, the sidewall spacer layer structure having a first height on the first side of the gate stack and extending into the first recess, the sidewall spacer layer structure having a second height on the second side of the gate stack and over the boundary structure, the first height being greater than the second height, where the sidewall spacer layer structure includes a first sidewall spacer layer adjoined to a second sidewall spacer layer. The method also includes etching the sidewall spacer layer structure to form an inner spacer in the sidewall recess.

In an embodiment, the method further includes depositing a source/drain region in the first recess; etching an opening over the first nanostructure and the second nanostructure; etching to extend the opening to remove the first nanostructure; and depositing a gate structure in the opening and around the second nanostructure, the inner spacer disposed between the gate structure and the source/drain region. In an embodiment, the first sidewall spacer layer and the second sidewall spacer layer each includes insulating oxide or insulating nitride including zero or more of Si, Al, C, Ge, B, P, Hf, La, Zr, or Ba. In an embodiment, the method further includes doping the first sidewall spacer layer or the second sidewall spacer layer with a first dopant. In an embodiment, prior to doping the first sidewall layer or the second sidewall layer, a material composition of the first sidewall layer as deposited is the same as a material composition of the second sidewall layer as deposited. In an embodiment, the method further includes depositing the sidewall spacer layer structure and before etching the sidewall spacer layer structure, cooling the sidewall spacer layer structure by a temperature between 50° C. and 300° C. In an embodiment, etching the sidewall spacer layer structure removes the second sidewall spacer layer, where the inner spacer includes only a portion of the first sidewall spacer layer.

Another embodiment is a device including a first nanostructure. The device also includes a second nanostructure over the first nanostructure. The device also includes a source/drain region adjacent the first nanostructure. The device also includes a gate structure surrounding the first nanostructure and the second nanostructure. The device also includes a first inner spacer interposed between the first nanostructure and the second nanostructure, the first inner spacer interposed between the gate electrode and the source/drain region, the first inner spacer having a first material composition, the first material composition having a first coefficient of thermal expansion (CTE). The device also includes a second inner spacer interposed between the first nanostructure and the second nanostructure, the second inner spacer interposed between the gate electrode and the source/drain region, the second inner spacer adjacent the first inner spacer, the second inner spacer having a second material composition, the second material composition having a second coefficient of thermal expansion (CTE), the second CTE being different than the first CTE.

In an embodiment, the first CTE is measurable on a first blank substrate having the first material composition deposited thereon, and the second CTE is measurable on a second blank substrate having the second material composition deposited thereon. In an embodiment, a ratio of the first CTE to the second CTE is between 10:1 and 10:9. A difference between the first CTE and the second CTE is between $1\times10^{-7}$/K and $2\times10^{-6}$/K. In an embodiment, the first inner spacer and the second inner spacer include an insulating material optionally combined with one or more of Si, Al, C, Ge, B, P, Hf, La, Zr, or Ba. In an embodiment, the source/drain region is disposed at a first side of the gate structure, further including a boundary insulating region disposed at an opposite side of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first fin protruding from a substrate, the first fin including a second nanostructure over a first nanostructure;
    forming an insulating structure laterally surrounding the first fin;
    removing a portion of the first fin and forming a boundary structure in the first fin;
    forming a dummy gate over the first fin, the dummy gate overlapping an edge of the boundary structure;
    etching a recess in the first fin adjacent the dummy gate, the recess exposing the first nanostructure and the second nanostructure;
    etching a sidewall recess in the first nanostructure;
    depositing a first inner spacer layer over the dummy gate, in the recess, and in the sidewall recess, the first inner spacer layer having a first coefficient of thermal expansion (CTE);
    depositing a second inner spacer layer over the dummy gate, in the recess, and in the sidewall recess, the second inner spacer layer having a second CTE;
    cooling the first inner spacer layer and the second inner spacer layer; and
    etching the first inner spacer layer and the second inner spacer layer to form a first inner spacer and a second inner spacer in the sidewall recess.

2. The method of claim 1, wherein the CTE of the first inner spacer layer is less than the CTE of the second inner spacer layer, wherein after cooling the first inner spacer layer and the second inner spacer layer, the second inner spacer layer provides a compressive force on the dummy gate and the first inner spacer layer provides a tensile force on the dummy gate.

3. The method of claim 1, wherein the second inner spacer layer is deposited before the first inner spacer layer.

4. The method of claim 1, wherein a ratio of the first CTE to the second CTE is between 1:10 and 9:10.

5. The method of claim 1, further comprising:
    doping the first inner spacer layer with a first dopant.

6. The method of claim 5, wherein a material of the first inner spacer layer prior to doping is the same as a material of the second inner spacer layer.

7. The method of claim 1, wherein the first inner spacer and the second inner spacer are comprised of an insulating material including an insulating oxide or nitride comprising zero or more of Si, Al, C, Ge, B, P, Hf, La, Zr, or Ba.

8. A method comprising:
    etching a first recess in a first nanostructure and a second nanostructure, the second nanostructure over the first nanostructure, the first recess disposed at a first side of a gate stack, a boundary structure disposed at a second side of the gate stack, the second side opposite the first side;
    etching, through the first recess, sidewalls of the first nanostructure to form a sidewall recess of the first nanostructure;
    depositing a sidewall spacer layer structure in the sidewall recess and over the gate stack, the sidewall spacer layer structure having a first height on the first side of the gate stack and extending into the first recess, the sidewall spacer layer structure having a second height on the second side of the gate stack and over the boundary structure, the first height being greater than the second height, wherein the sidewall spacer layer structure includes a first sidewall spacer layer adjoined to a second sidewall spacer layer;
    doping the first sidewall spacer layer or the second sidewall spacer layer with a first dopant; and
    etching the sidewall spacer layer structure to form an inner spacer in the sidewall recess.

9. The method of claim 8, further comprising:
    depositing a source/drain region in the first recess;
    etching an opening over the first nanostructure and the second nanostructure;
    etching to extend the opening to remove the first nanostructure; and
    depositing a gate structure in the opening and around the second nanostructure, the inner spacer disposed between the gate structure and the source/drain region.

10. The method of claim 8, wherein the first sidewall spacer layer and the second sidewall spacer layer each comprises insulating oxide or insulating nitride comprising zero or more of Si, Al, C, Ge, B, P, Hf, La, Zr, or Ba.

11. The method of claim 8, wherein prior to doping the first sidewall spacer layer or the second sidewall spacer layer, a material composition of the first sidewall spacer layer as deposited is the same as a material composition of the second sidewall spacer layer as deposited.

12. The method of claim 8, further comprising:
    after depositing the sidewall spacer layer structure and before etching the sidewall spacer layer structure, cooling the sidewall spacer layer structure by a temperature between 50° C. and 300° C.

13. The method of claim 8, wherein etching the sidewall spacer layer structure removes the second sidewall spacer layer, wherein the inner spacer includes only a portion of the first sidewall spacer layer.

14. The method of claim 8, wherein the boundary structure extends along sidewalls of the first nanostructure and the second nanostructure.

15. A device comprising:
    a first nanostructure;
    a second nanostructure over the first nanostructure;

a boundary insulating region disposed at a first side of the first nanostructure and the second nanostructure, the boundary insulating region extending along sidewalls of the first nanostructure and the second nanostructure;

a source/drain region adjacent a second side of the first nanostructure;

a gate structure surrounding the first nanostructure and the second nanostructure;

a first inner spacer interposed between the first nanostructure and the second nanostructure, the first inner spacer interposed between the gate structure and the source/drain region, the first inner spacer having a first material composition, the first material composition having a first coefficient of thermal expansion (CTE); and a second inner spacer interposed between the first nanostructure and the second nanostructure, the second inner spacer interposed between the gate structure and the source/drain region, the second inner spacer adjacent the first inner spacer, the second inner spacer having a second material composition, the second material composition having a second coefficient of thermal expansion (CTE), the second CTE being different than the first CTE.

16. The device of claim 15, wherein the first CTE is measurable on a first blank substrate having the first material composition deposited thereon, and wherein the second CTE is measurable on a second blank substrate having the second material composition deposited thereon.

17. The device of claim 15, wherein a ratio of the first CTE to the second CTE is between 10:1 and 10:9.

18. The device of claim 15, wherein a difference between the first CTE and the second CTE is between $1\times10^{-7}$/K and $2\times10^{-6}$/K.

19. The device of claim 15, wherein the first inner spacer and the second inner spacer are comprised of an insulating material optionally combined with one or more of Si, Al, C, Ge, B, P, Hf, La, Zr, or Ba.

20. The device of claim 15, wherein the gate structure is directly over an interface between the source/drain region and the boundary insulating region.

* * * * *